United States Patent [19]
Furukawa et al.

[11] Patent Number: 5,591,960
[45] Date of Patent: Jan. 7, 1997

[54] PHOTOELECTRIC CONVERTER WITH SIGNAL PROCESSING

[75] Inventors: Tatsuo Furukawa; Toshiki Nakayama, both of Atsugi, Japan

[73] Assignee: Canon Kabushiki Kaisha, Tokyo, Japan

[21] Appl. No.: 392,619

[22] Filed: Feb. 22, 1995

Related U.S. Application Data

[63] Continuation of Ser. No. 280,585, Jul. 26, 1994, abandoned, which is a continuation of Ser. No. 90,625, Jul. 12, 1993, abandoned, which is a continuation of Ser. No. 874,209, Apr. 27, 1992, abandoned, which is a continuation of Ser. No. 661,291, Feb. 27, 1991, abandoned.

[30] Foreign Application Priority Data

Feb. 28, 1990 [JP] Japan ................................ 2-48076

[51] Int. Cl.$^6$ ............................................ G03B 13/36
[52] U.S. Cl. .................... 250/208.1; 250/201.8; 396/96
[58] Field of Search .................. 250/208.1, 201.8; 358/213.23; 354/406, 407, 408

[56] References Cited

U.S. PATENT DOCUMENTS

| | | | |
|---|---|---|---|
| 4,751,559 | 6/1988 | Sugawa et al. | |
| 4,812,869 | 3/1989 | Akashi et al. | 354/408 |
| 5,010,245 | 4/1991 | Dierikx | 250/208.1 |
| 5,029,998 | 7/1991 | Utagawa et al. | 354/402 |
| 5,483,318 | 1/1996 | Hamada et al. | 354/402 |

FOREIGN PATENT DOCUMENTS

| | | |
|---|---|---|
| 0222624 | 5/1987 | European Pat. Off. |
| 0275217 | 7/1988 | European Pat. Off. |
| 0311529 | 12/1989 | European Pat. Off. |
| 0400754 | 12/1990 | European Pat. Off. |
| 58-127370 | 10/1983 | Japan . |
| 63-018314 | 1/1988 | Japan . |

OTHER PUBLICATIONS

Teruo Sakurai, et al., "Four–Channel Optoelectronic Integrated Circuits," 2311 Fujitsu–Scientific & Technical Journal 23 (1987) Spring, No. 1, Kawasaki, Japan pp. 1–16.

*Primary Examiner*—Constantine Hannaher
*Attorney, Agent, or Firm*—Fitzpatrick, Cella, Harper & Scinto

[57] ABSTRACT

A photoelectric converter has photodetectors having plural arrays wherein plural photoreceiving elements are arranged for detecting incident light. The converter has a reading circuit for reading an output signal from the photodetector, the reading circuit having a detection circuit for detecting maximum and minimum signals from the plural photoreceiving elements of the photodetector. The photoelectric converter has at least three arrays arranged parallel to each other or substantially parallel to each other, and at least one array is arranged in a direction perpendicular to the at least three arrays. The reading circuit is arranged adjacent to the plural arrays, and the photodetectors and the reading circuit are provided on a common substrate.

10 Claims, 22 Drawing Sheets

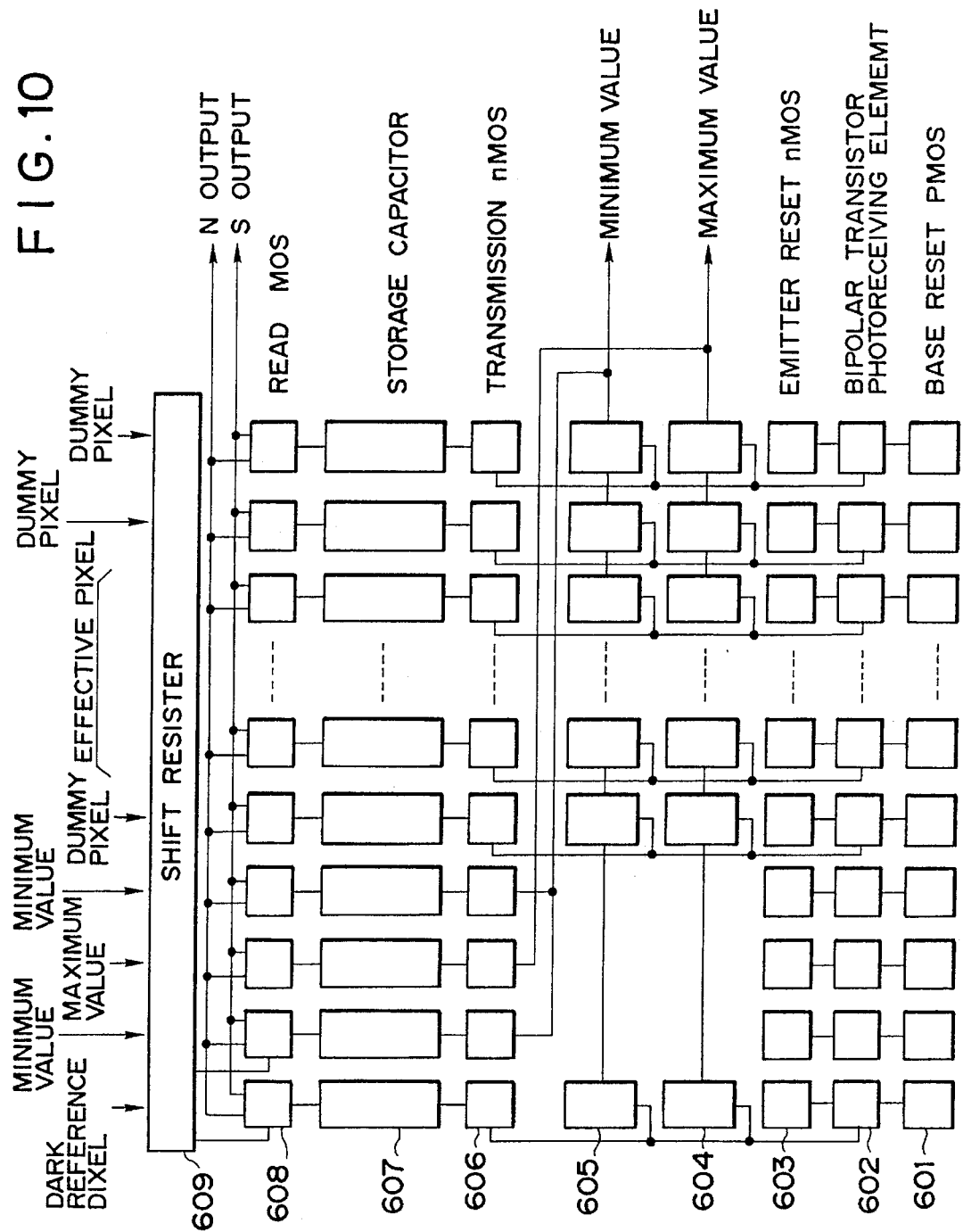

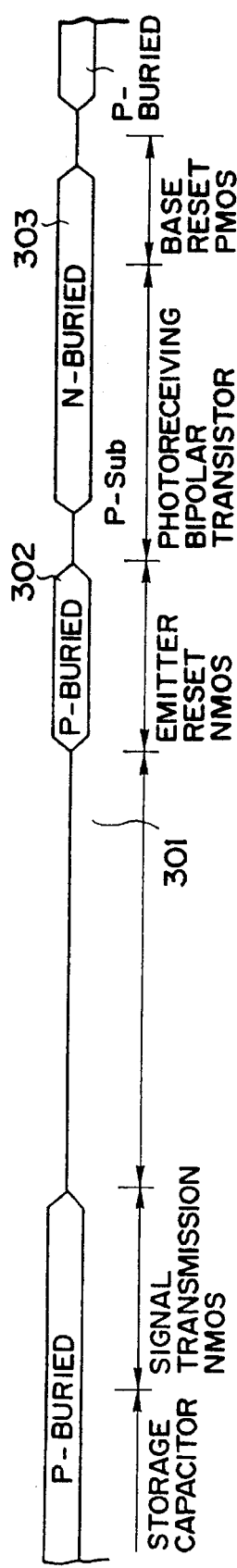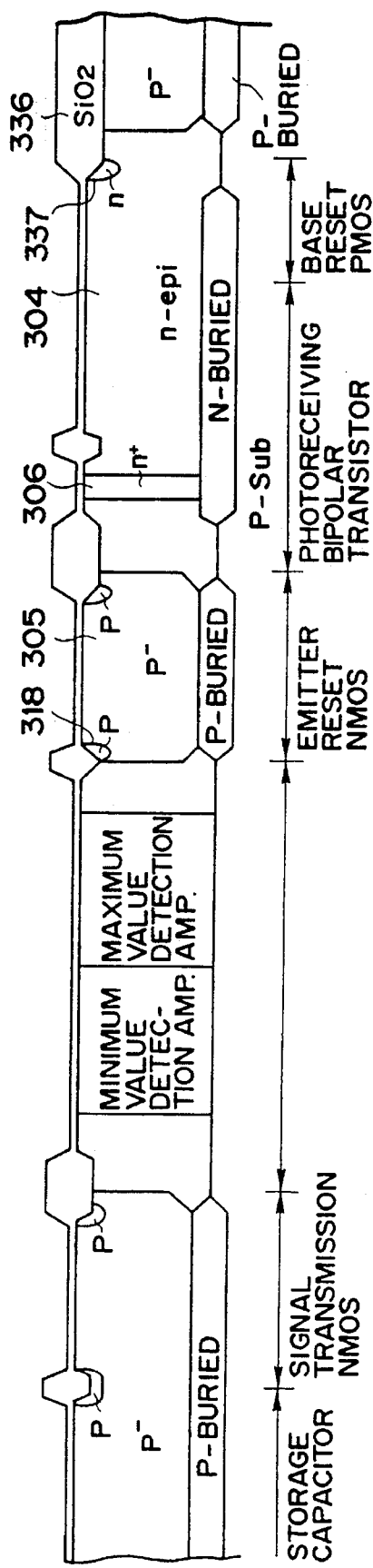
FIG. 12A
FIG. 12B

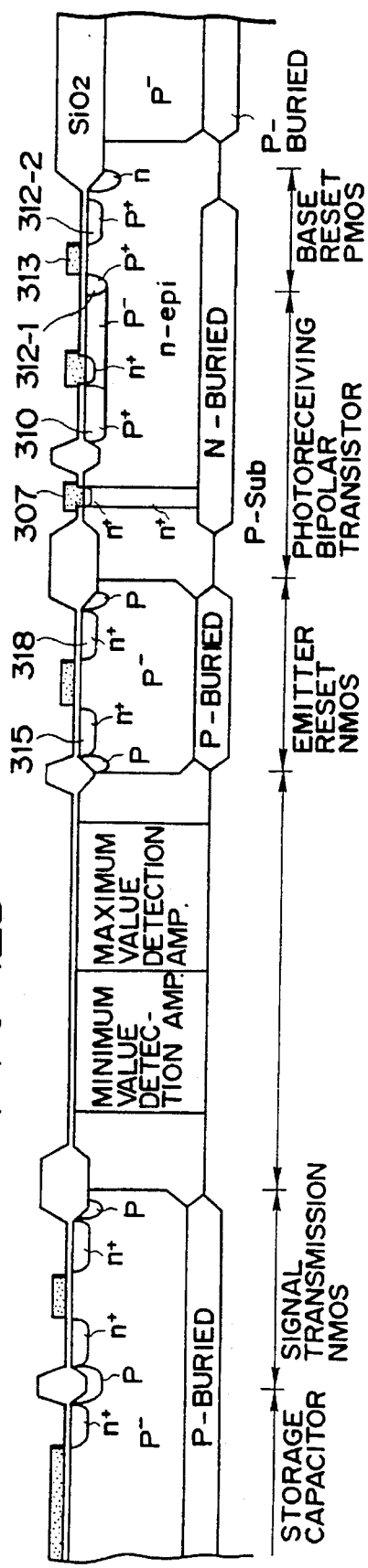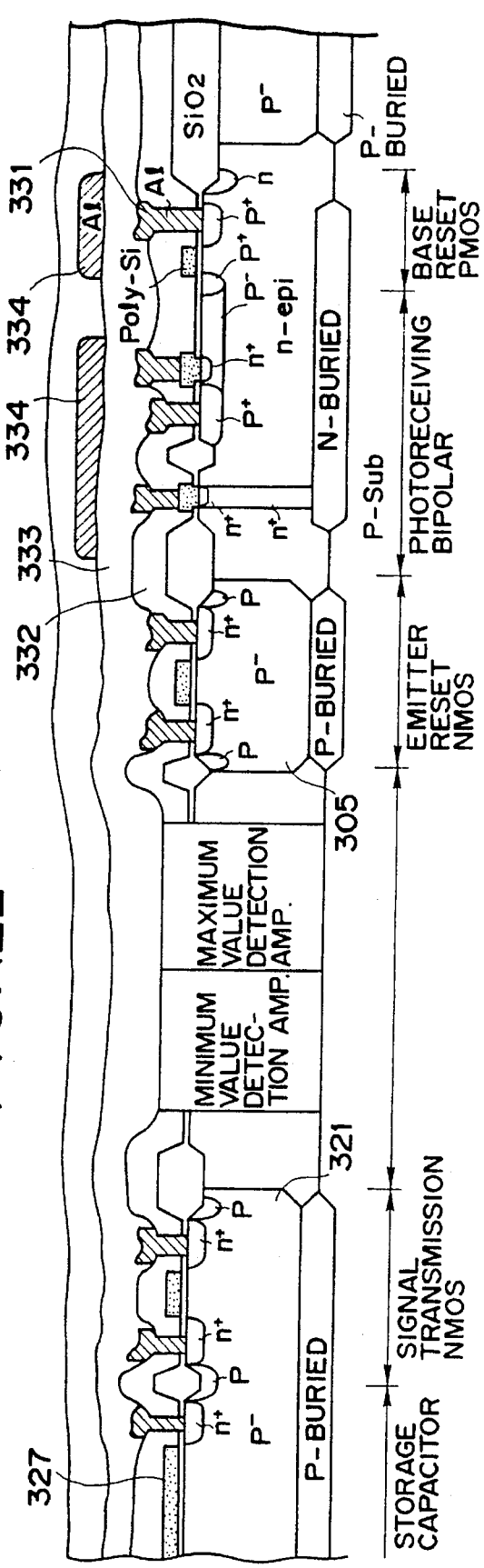
FIG. 12D
FIG. 12E

PHOTOELECTRIC CONVERTER WITH SIGNAL PROCESSING

CROSS-REFERENCES TO RELATED APPLICATIONS

This application is continuation of application Ser. No. 08/280,585 filed Jul. 26, 1994, now abandoned, which is a continuation of application Ser. No. 08/090,625 filed Jul. 12, 1993, now abandoned, which is a continuation of application Ser. No. 07/874,209 filed Apr. 27, 1992, now abandoned, which is a continuation of application Ser. No. 07/661,291 filed Feb. 27, 1991, now abandoned.

BACKGROUND OF THE INVENTION

1. Field of the Invention

This invention relates to photoelectric converters and, more particularly, to a photoelectric converter, which comprises a plurality of photoelectric conversion elements capable of storing photoelectrically produced charge. More specifically, the invention concerns a photoelectric converter, which can be suitably used for passive focus detectors for optical apparatuses such as cameras, slide projectors and liquid crystal projectors.

2. Related Background Art

Heretofore, a photoelectric converter of the above type has been proposed by the applicant and disclosed in Japanese Patent Laid-Open Application No. 1-222583.

FIG. 14 shows an equivalent circuit diagram of a photoelectric conversion element array shown in Japanese Patent Laid-Open Application No. 1-222583.

Referring to FIG. 14, designated at 1-1 to 1-$n$ are phototransistors (or cells) of storage type. These phototransistors have such a structure that their collector is connected to a common power supply, and they can store photoelectrically produced charge in their control electrode area (i.e., base) and let stored charge be read out from their main electrode area (i.e., emitter). The structure is described in detail in Japanese Patent Laid-Open Application No. 62-128678, Japanese Patent Laid-Open Application No. 62-113468, Japanese Patent Laid-Open Application No. 63-24664, Japanese Patent Laid-Open Application No. 63-76476 and Japanese Patent Laid-Open Application No. 63-76582. Designated at 2-1 to 2-$n$ are POMS switches for resetting the bipolar transistors of phototransistor array 1 by connecting the bases thereof to power supply $V_c$ when $\phi_{res}$ is given, at 3-1 to 3-$n$ are NMOS switches each connected to the emitter of each bipolar transistor for taking out stored signal to the following stage in synchronism to $\phi_t$, at 4-1 to 4-$n$ NMOS switches each connected in series with each of NMOS switches 3-1 to 3-$n$ for sending out image signal to read line 7, and at 5-1 to 5-$n$ are storage capacitors each for reading out signal for each of pixels connected between points of connection between NMOS switches 3-1 to 3-$n$ and 4-1 to 4-$n$ and ground. Designated at 6 is a shift register for reading out image signal by sequentially turning on NMOS switches 4-1 to 4-$n$, 8 a NMOS switch for connecting read line 7, to which output terminals of NMOS switches 4-1 to 4-$n$ are commonly connected, to ground for initialization when signal $\phi_{nrs}$ is given, and at 9 is an output amplifier for amplifying image signal output to read line 7. Designated at 10-1 to 10-$n$ are NMOS switches for grounding the emitter of each of phototransistors 1-1 to 1-$n$ when $\phi_{vrs}$ is given. Designated at 107 is a maximum/minimum value detection circuit, which includes maximum value detection circuits 11-1 to 11-$n$, minimum value detection circuits 12-1 to 12-$n$ and output amplifiers 13 and 14.

FIG. 15 shows the structure of one minimum value detection circuit.

As shown in FIG. 15, one minimum value detection circuit is constituted by a single differential amplifier 30 and a single pnp transistor 31. Differential amplifier 30 is constituted by constant current circuit 411, PMOS transistors 407 and 408 and NMOS transistors 409 and 410. The emitter line of pnp transistor 31 is fed back to inversion input terminal In2 of differential amplifier 30, and to non-inversion input terminal In1 thereof is connected each emitter of the pixel array of phototransistors 1-1 to 1-$n$. When the level of non-inversion input In1 of differential amplifier 30 exceeds the level of inversion input In2, the base potential on pnp transistor 31 is changed substantially to the power supply voltage level to turn off pnp transistor 31. In consequence, no voltage is provided as input to output amplifier 13 shown in FIG. 14. When the lowest level voltage is supplied as non-inversion input In1 to differential amplifier 30, pnp transistor 31 produces an output voltage, which is indicative of detection of the minimum value.

FIG. 16 shows the structure of one maximum value detection circuit.

As shown in FIG. 16, one maximum value detection circuit is constituted by a single differential amplifier 32 and a single npn transistor 33. Differential amplifier 32 is constituted by constant current circuit 401, PMOS transistors 402 and 403 and NMOS transistors 404 and 405. The emitter line of npn transistor 33 is fed back to inversion input terminal In2 of differential amplifier 32 and also to an output line. To non-inversion input terminal In1 is connected each emitter of each pixel row. When non-inversion input In1 of differential amplifier 32 becomes lower in level than inversion input In2, the base potential on npn transistor 33 is lowered substantially to the voltage level of negative power supply, thus turning off npn transistor 33. When the highest voltage is supplied as non-inversion input In1 to differential amplifier 32, npn transistor 33 produces an output voltage, which is indicative of detection of the maximum value. In both minimum and maximum value detection circuit, load resistance is denoted by R.

FIG. 17 is a timing chart for explaining the operation of the photoelectric conversion element array shown in FIG. 14.

In the first place, resetting is done. Then, $\phi_{res}$ is held at low level for a period from instant $t_1$ to instant $t_2$, thus turning on PMOS switches 2-1 to 2-$n$ to fix the base potential on phototransistors 1-1 to 1-$n$ of the array (hereinafter referred to pixel row) to $V_c$.

Subsequently, $\phi_{vrs}$ and $\phi_t$ are held at high level (i.e., "on") from instant $t_3$ to instant $t_4$, thus turning on NMOS switches 10-1 to 10-$n$ and 3-1 to 3-$n$ to ground storage capacitors 5-1 to 5-$n$ and reset residual charge. When the resetting with respect to the bases and emitters of pixel row 1-1 to 1-$n$ is ended, storage operation sets in.

When the storage operation sets in, photoelectrically produced charge is stored in base areas of pixel row 1-1 to 1-$n$. At this time, the bases and emitters of the pixel row are floating (i.e., in capacitive load state), and a voltage reflecting base potential is present at the emitters.

For sequential reading of signal, NMOS switches 4-1 to 4-$n$ are sequentially turned on by shift register 6, thus reading out signal charges stored in storage capacitors 5-1 to 5-$n$ to read line 7. Shift register 6 selects NMOS switches 4-1 to 4-$n$ one by one each time when $\phi_{ck}$ is given. Right before selection NMOS switches 4-1 to 4-n, NMOS switch 8 is turned on under control of $\phi_{nrs}$ to reset charge remaining on read line 7.

Japanese Patent Laid-Open Application No. 1-222583 proposes a method of performing A/D conversion of only featuring portions of an object pattern through storage time control such as to make constant the difference between bright and dark portions of the pattern by constructing a photoelectric converter as shown in FIGS. 8 and 9 with a photoelectric conversion element array provided with maximum and minimum value detection circuits as noted above.

In this method, a check as to whether storage is performed up to an adequate level is done through a check as to whether reference level $V_{ref}$ is reached by the difference between maximum and minimum values of storage level of the photoelectric conversion element array. Designated at 102 is a differential amplifier for taking the difference between $V_{max}$ and $V_{min}$, and 103 is a comparator for comparing the output of differential amplifier 102 to predetermined reference level $V_{ref}$ to determine the reaching of adequate storage level. When signal $\phi_{comp}$ of comparator 103 is inverted, microcomputer 104 detects the reaching of the reference level of storage and provides pulse $\phi_t$ indicative of the ending of storage to photoelectric conversion element array 101. At the same time, it provides signal SH to memory circuit 105 for memorization of level of $V_{min}$ at the end of storage. Then, $\phi_{ck}$ and $\phi_{nrs}$ are provided as read pulses, whereby video signal from photoelectric conversion element is read out for A/D conversion.

In the example of FIG. 8, the A/D conversion range is subject to level shift according to the range of video signal. In the example of FIG. 9, video signal is subject to level shift according to A/D conversion range. In either case, A/D conversion is effected between the maximum and minimum values of video signal.

The digitalized pixel signal which is obtained in the above way is used for focus judgement through calculation as disclosed in Japanese Patent Laid-Open Application No. 58-142306, Japanese Patent Laid-Open Application No. 59-107313, Japanese Patent Laid-Open Application No. 60-101513 or Japanese Patent Laid-Open Application No. 61-18314 (which corresponds to U.S. Pat. No. 4,812,869).

However, with the above prior art photoelectric converter actual maximum and minimum values of pixel signal and values of $V_{max}$ and $V_{min}$ are subject to deviation due to such causes different read-out gains of different reading circuits, through which the maximum and minimum values of video signal and photoelectric conversion element array storage signal are provided, and also to mismatching of amplifiers 9, 13 and 14. In addition, where stored charge control is effected according to the difference between $V_{max}$ and $V_{min}$ as in the examples of FIGS. 11 and 12, the video signal is liable to partially exceed the A/D conversion range.

The read-out gain difference is produced in the following way. Denoting the capacitance of storage capacitor 5-1 and parasitic capacitance of read line 7 in FIG. 4 by $C_{T1}$ and $C_H$, respectively, the output obtained when emitter potential $V_{E1}$ of phototransistor 1-1 is read out to line 7 is $$\frac{C_{T1}}{C_{T1}+C_H} \cdot V_{E1}$$

and the gain is not unity.

Nevertheless, the outputs of $V_{min}$ and $V_{max}$ are read output with unity gain. Consequently, deviations are produced. To solve this problem, the applicant has proposed a photoelectric converter as disclosed in Japanese Patent Application No. 3-163972.

However, according to Japanese Patent Application No. 1-301818 the following problem is presented, which is desired to be improved.

With a structure where the maximum and minimum values are detected and provided to the same line as the video signal, unless satisfactory balance is obtained between a bus leading from photoreceiving element through read circuit to common output line and a bus leading from maximum/minimum value detection circuit to common output line, the signal-to-noise ratio is reduced, thus resulting in a signal with great fluctuations for individual bits. In such case, it is insufficient to improve the quality of the video signal itself. That is, it is necessary to accurately detect maximum/minimum value data for determining the storage time of photoreceiving element. In addition, it is necessary to let detected maximum/minimum value data be led to the common output line without imparting any noise component.

Particularly, recently two-dimensional photoelectric conversion element array arrangement is desired for photoelectric converters for photo-measurement in order to obtain sensing of object in longitudinal and transversal directions. To obtain such a structure, it may be thought to arrange a plurality of photoelectric converter chips in longitudinal and transversal directions. Adoptation of such structure, however, leads to increased cost of manufacture. In addition, depending on combination, only signal of low signal-to-noise ratio can be obtained.

Particularly, pronounced reduction of the signal-to-noise ratio is liable in case where a digital circuit for generating a clock signal or the like for driving a corresponding photoelectric conversion element array is disposed near a photoreceiving element array section of a different photoelectric conversion element array. A significant cause of this is the introduction of noise component from the digital circuit into the photoelectrically produced signal.

Further, where a photoelectric conversion element array located at an end of a chip containing a plurality of photoelectric conversion element arrays is arranged such that its photoreceiving element section is on the inner side while its read circuit section is on the outer side, the photoreceiving element section is affected by the inner adjacent photoelectric conversion element array in the remaining arrays, leading to failure of accurate reading of signal.

SUMMARY OF THE INVENTION

The inventors have found a structure consisting of a combination of pluralities of photoreceiving element array sections, read circuit sections, digital circuit sections and analog signal processing sections, which structure permits high level signal to be obtained with least noise, and they seek to further reduce noise by locating some of such sections in an integrated fashion on a semiconductor chip at a predetermined position thereof.

Another object of the invention is to provide a photoelectric converter, which comprises a photoreceiving element capable of storing photoelectrically produced charge, a detecting circuit for detecting at least either a signal of in a photoelectric conversion element, on which light of the highest intensity is incident, or a signal of storage in a photoelectric conversion element, on which light of the lowest intensity is incident, a reading circuit for reading a signal based on photoelectrically produced signal charge from said photoreceiving element, and a signal processing circuit for processing signal read out from said reading circuit, the element and circuits being provided on a common substrate, the detecting circuit being provided between the photoreceiving element and reading circuit.

It is a further object of the invention to provide an optical apparatus including the above photoelectric converter.

It is a still further object of the invention to provide a photoelectric converter, which comprises a photoreceiving element capable of storing photoelectrically produced charge, a detecting circuit for detecting at least either a signal of storage in a photoelectric conversion element of the highest or substantially high intensity or a signal of storage in a photoelectric conversion element of the lowest or substantially low intensity, a reading circuit for reading a signal based on a photoelectrically produced signal charge out of the photoreceiving element, and a signal processing circuit for processing signal read out from the reading circuit, the element and circuits being provided on a common substrate, the detecting circuit being provided between the photoreceiving element and reading circuit, as well as an optical apparatus including said photoelectric converter.

BRIEF DESCRIPTION OF THE DRAWINGS

FIG. 10 is a schematic plan view showing a first construction of photoelectric conversion element array in the photoelectric converter according to the invention;

FIGS. 12A to 12E and 13A to 13E are flow charts illustrating a method of manufacturing a photoelectric conversion element array in the photoelectric converter according to the invention;

DETAILED DESCRIPTION OF THE PREFERRED EMBODIMENTS

Now, embodiments of the invention will be described in detail with reference to the drawings, as follows.

Explanation of Photoelectric Converter Construction

Figure 1:
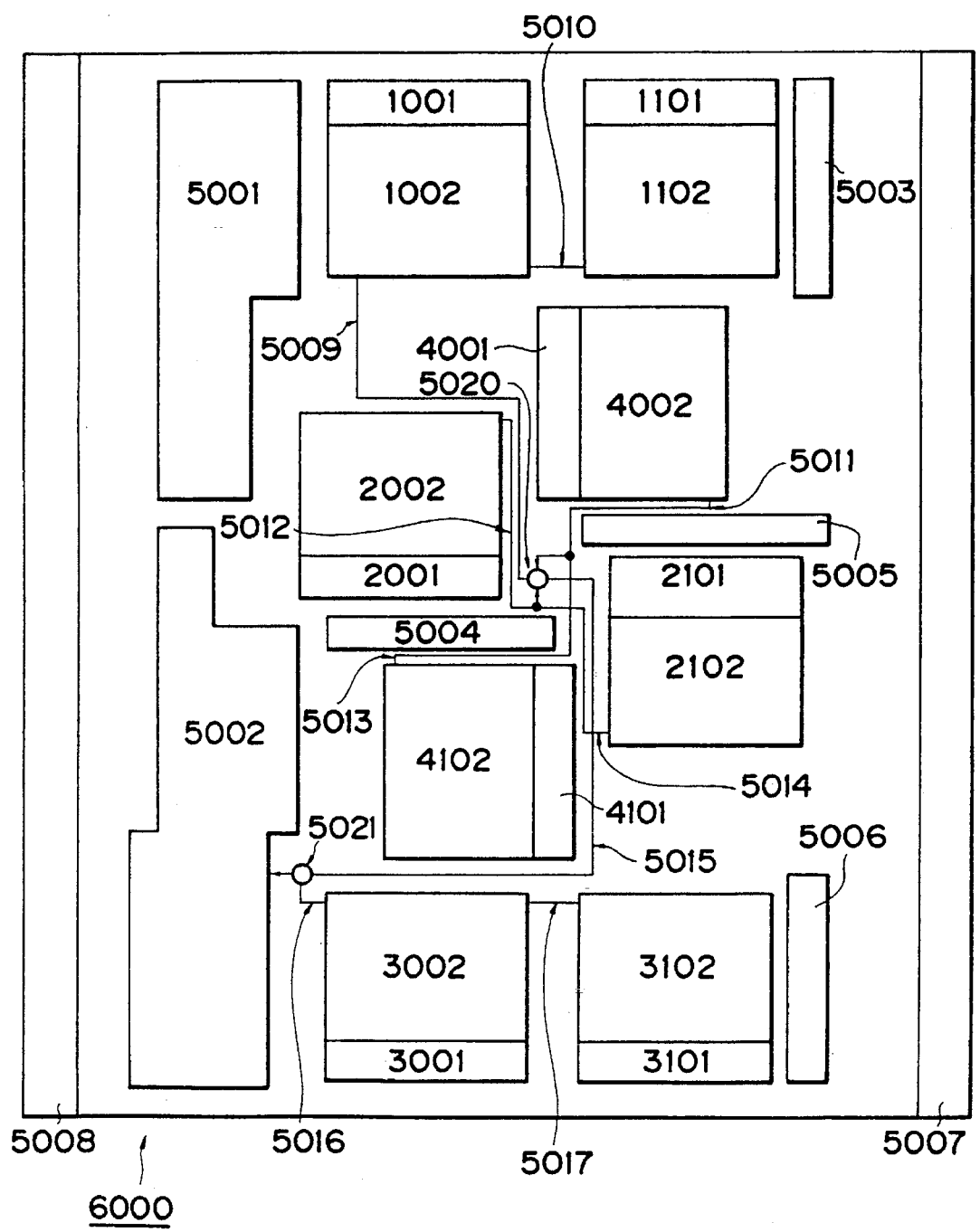
FIG. 1 is a schematic top plan view showing the construction and arrangement of a photoelectric converter according to the invention.

FIG. 1 is a schematic plan view for explaining the construction of a photoelectric converter according to the invention.

Designated at 1001, 1101, 2001, 2101, 3001, 3101, 4001 and 4101 are photoreceiving element arrays in photoelectric conversion element arrays, and at 1002, 1102, 2002, 2102, 3002, 3102, 4002 and 4102 are reading circuit sections of the photoelectric conversion element arrays. One of the photoreceiving element arrays and a corresponding one of the reading circuit sections constitute one of the photoelectric conversion element arrays. Each reading circuit section is constituted by an NMOS switch, a storage capacitor, a maximum value detector, a minimum value detector and so forth, as will be described later. In the present construction, a plurality of (i.e., 8) photoelectric conversion element arrays are provided on a semiconductor chip in an arrangement of three transversal rows each of two arrays and another row of two arrays extending in a perpendicular direction to the first-mentioned two rows. Photoreceiving sections 1001, 1101, 3001 and 3101 are formed adjacent to ends of the chip and corresponding reading circuit sections 1002, 1102, 3002 and 3102 are formed on the inner side of the chip. Thus, at least in these four photoelectric conversion element arrays light from the end is prevented from being incident on reading circuits and causing erroneous operation.

Photoelectric conversion element arrays including reading circuit sections 1002 and 1102 are connected to read line 5010 and provide signal to analog signal processing circuit section 5002 through lines 5009 and 5015.

Likewise, photoelectric conversion element arrays including reading circuit sections 1002 and 1102 are connected to each other by line 5017, and they are connected to line 5015 via line 5016 and switch 5021.

Photoelectric conversion element arrays including reading circuit sections 2002 and 2102 are connected to line 5015 through lines 5012 and 5014 and switch 5020.

Likewise, photoelectric conversion element arrays including reading circuit sections 4002 and 4102 are connected to line 5015 through lines 5011 and 5013 and switch 5020.

In this way, the read lines are led via switch and line 5015 extending through a substantially central area of the chip defined by photoreceiving element arrays 4001, 4101, 2001 and 2101 to analog signal processing circuit section 5002. Clock generators for generating clocks for driving the individual photoelectric conversion element arrays as well as digital circuit section serving as I/O and analog signal processing circuit section are collectively and integrally provided at predetermined end portions of the chip to prevent generated noise from having adverse effects on the read lines.

Designated at 5003, 5004, 5005 and 5006 are comparators for controlling storage time and respectively correspond to reading circuit sections 1002 and 1102, reading circuit sections 4002 and 4102, reading circuit section 2002 and 2102 and reading circuit section 3002 and 3102.

Designated at 5007 and 5008 are pad sections each having a plurality of pads for electric connection to parts outside the chip.

Brief Explanation of Photoelectric Conversion Element Array

Figure 2:
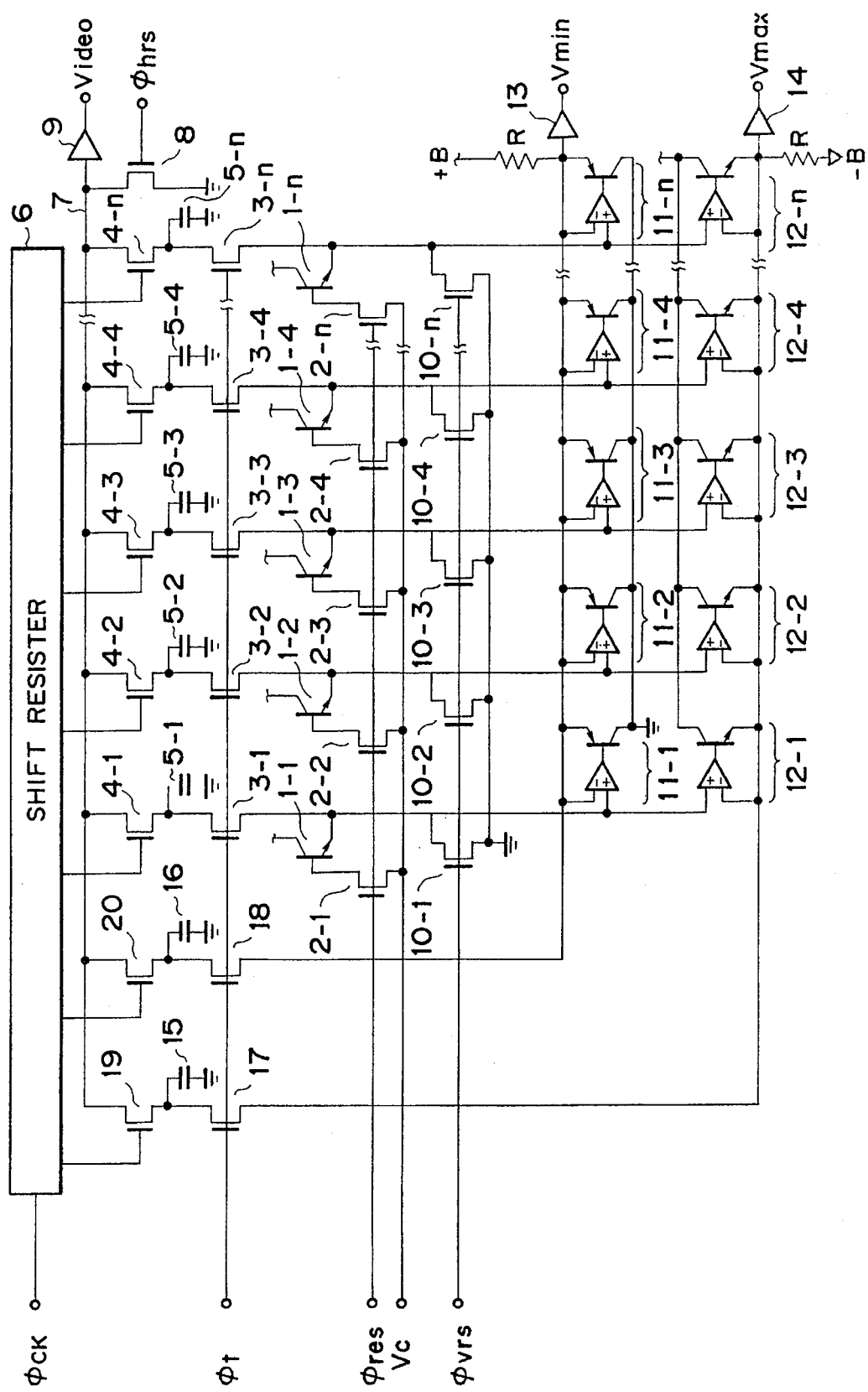
FIG. 2 is a circuit diagram showing the construction of a first embodiment of photoelectric conversion element array as featuring part of the photoelectric converter according to the invention.

FIG. 2 is a circuit diagram showing the construction of a photoelectric conversion element array as a featuring part of the photoelectric converter according to the invention. Here, one of the eight photoelectric conversion element arrays shown in FIG. 1 will be described. Parts like those shown in FIG. 14 are designated by like reference numerals and symbols, and their further description is not given.

Figure 14:
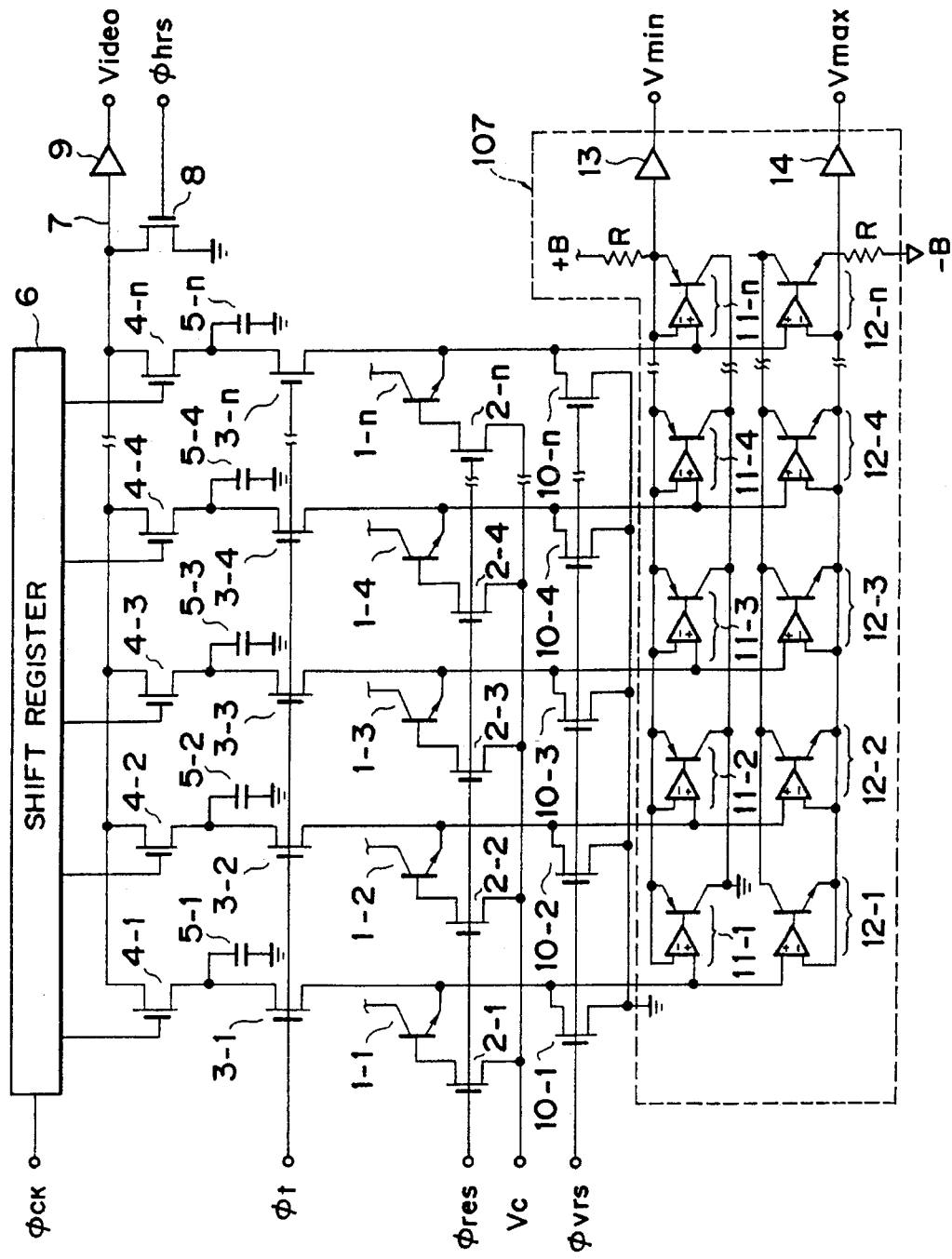
FIG. 14 is an equivalent circuit diagram of a photoelectric conversion element array shown in Japanese Patent Application No. 63-47644.
Figure 15:
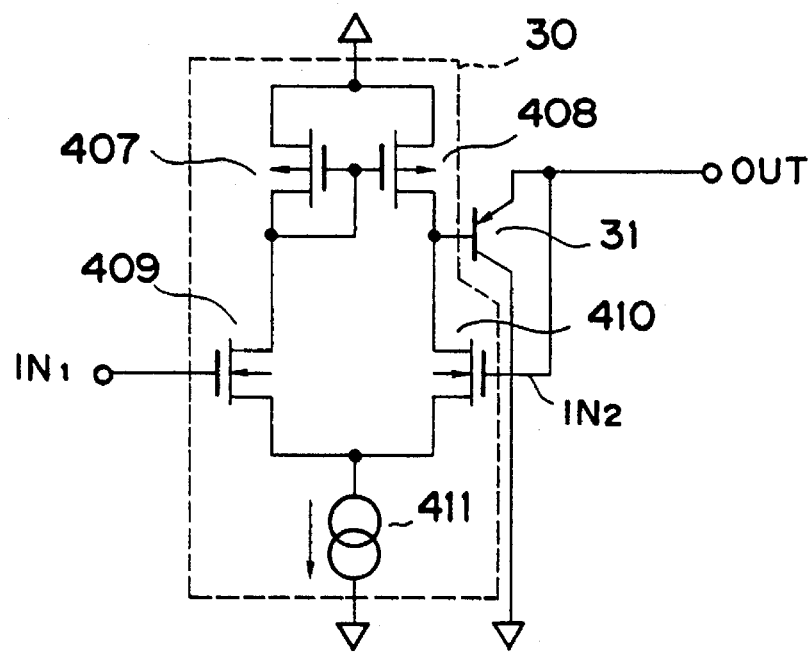
FIG. 15 is a circuit diagram showing a unit structure of minimum value detection circuit.
Figure 16:
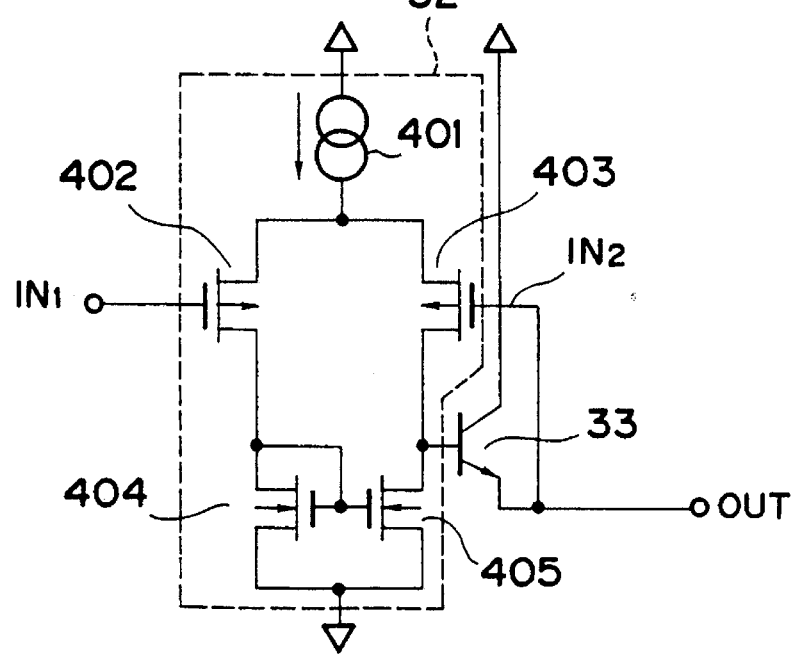
FIG. 16 is a circuit diagram showing unit structure of the maximum value detection circuit.
Figure 17:
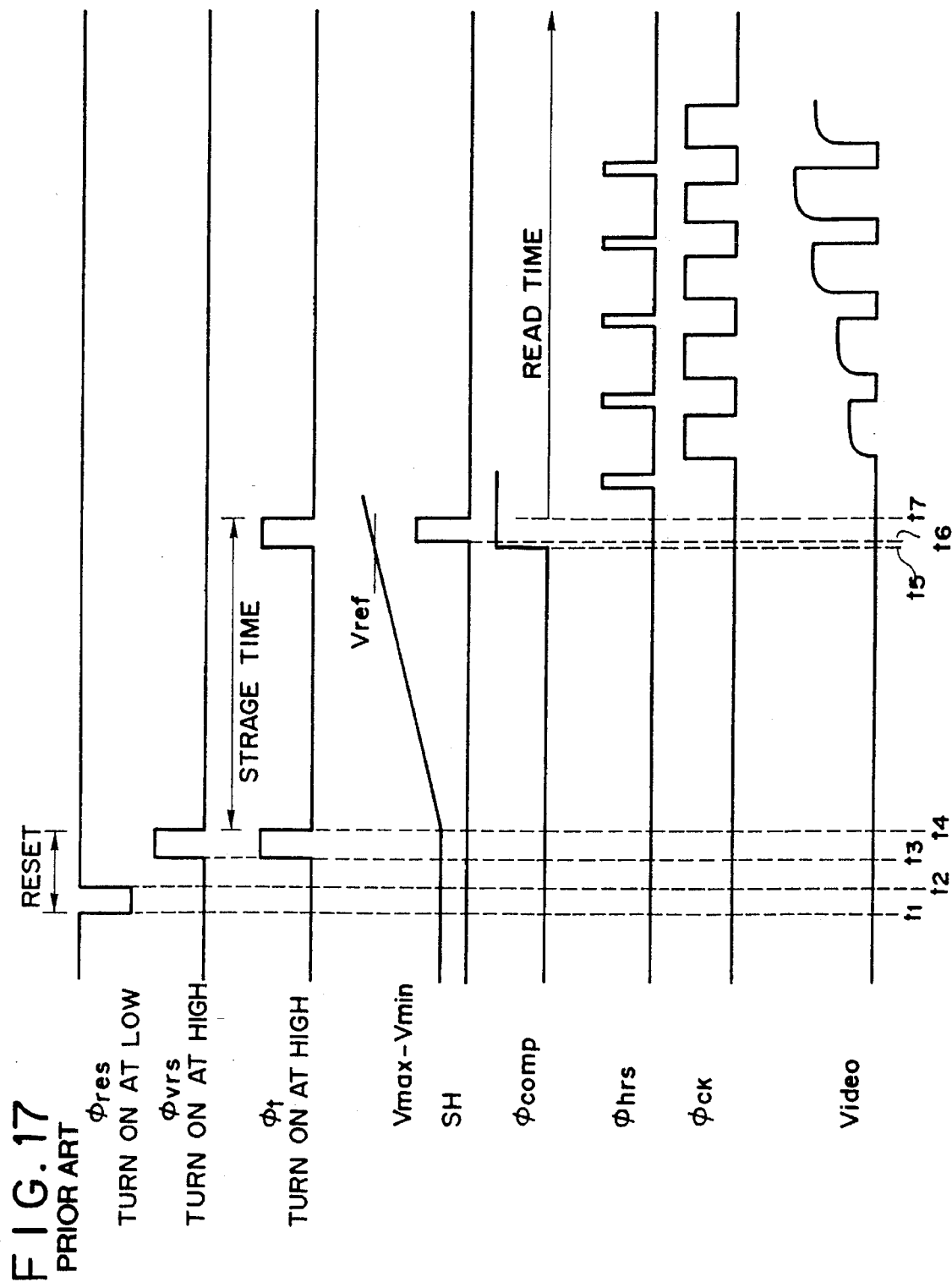
FIG. 17 is a timing chart for explaining the operation of the photoelectric conversion element array shown in FIG. 14.
Figure 18:
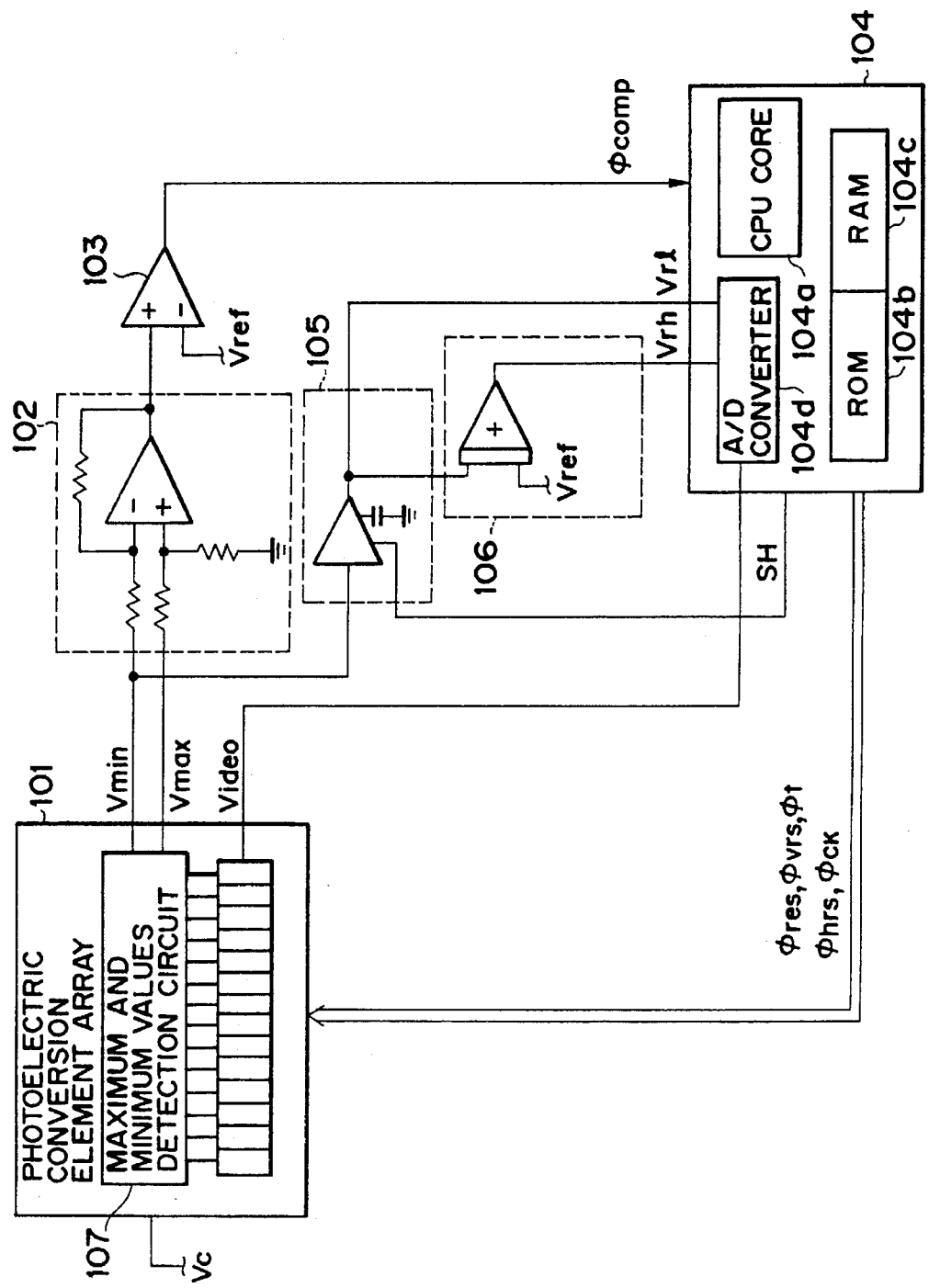
FIGS. 18 and 19 are block diagrams showing specific examples of prior art photoelectric converter using photoelectric conversion element array.
Figure 19:
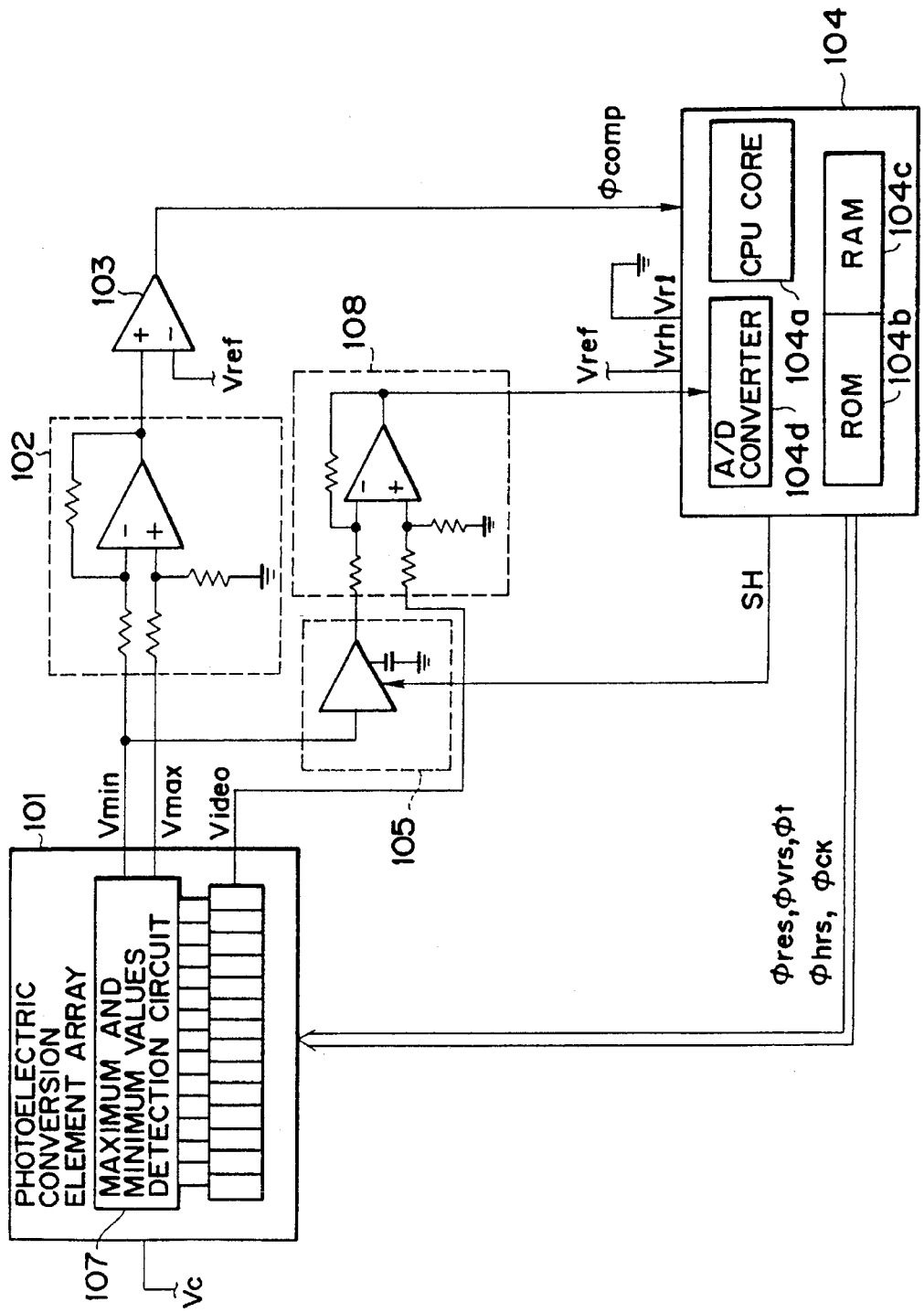

As shown in the Figure, the photoelectric conversion element array according to the invention includes the following parts in addition to the prior art photoelectric conversion element array shown in FIG. 14. Designated at 17 and 18 are NMOS switches connected to the output side of maximum value detection circuits 12-1 to 12-n and also to the output side of minimum value detection circuits 11-1 to 11-n for providing maximum and minimum values to the following stage in synchronism to $\phi_t$. Designated at 19 and 20 are NMOS switches connected in series with respective NMOS switches 17 and 18 for providing maximum and minimum values to output line 7. Designated at 15 and 16 are storage capacitors connected between the points of connection of NMOS switches 17 and 18 and NMOS switches 19 and 20 and ground for reading out maximum and minimum values.

Figure 3:
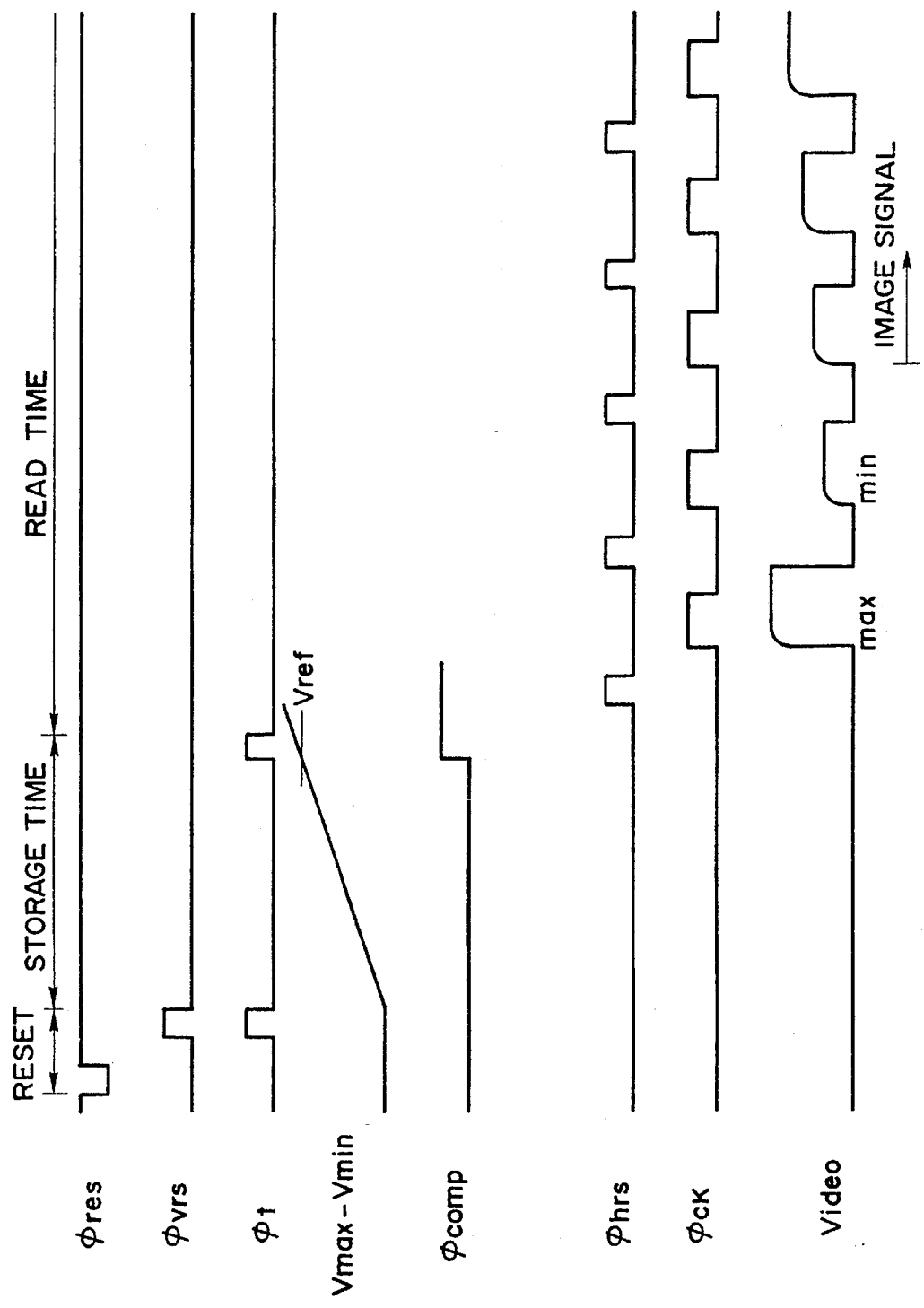
FIG. 3 is a timing chart for explaining the operation of photoelectric conversion elements in the first embodiment.

FIG. 3 is a timing chart for explaining the operation of the photoelectric conversion element array.

The operation up to the start of storage is like the operation of the prior art photoelectric conversion element array described before in connection to FIGS. 14 to 17, and its description is not given.

When storage operation sets in, photoelectrically produced charge is stored in control electrode areas (i.e., base areas) of pixel row 1-1 to 1-n. At this time, the bases and emitters of pixel row 1-1 to 1-n are floating (i.e., in a state bearing capacitive load), and a voltage reflecting the base potential is present at the emitters. At $V_{max}$, an output corresponding the maximum output of pixel row 1-1 to 1-n is provided, and at $V_{min}$ an output corresponding to the minimum output of pixel row 1-1 to 1-n is provided.

At the end of storage, the maximum and minimum output levels and output levels of the individual pixels at that instant are stored in storage capacitors 5-1 to 5-b under control of transmission pulse $\phi_t$. At the time of reading, NMOS switches 19, 20 and 4-1 to 4-n are sequentially turned on by shift register 6 to read out signals stored in storage capacitors 15, 16 and 5-1 to 5-n to read line 7. Shift register 6 sequentially selects NMOS switches 19, 20 and 4-1 to 4-b every time $\phi_{ck}$ is input. Right before selection of NMOS switches 19, 20 and 4-1 to 4-n, NMOS switch 8 is turned on by $\phi_{nrs}$ to reset charge remaining on read line 7.

It will be appreciated that in this embodiment the maximum and minimum output signals of the photoelectric conversion element array can be read out at the end of storage to the same read line through reading circuit common to the individual pixels. Thus, there is neither reading gain difference nor adverse effect due to amplifier mismatching, and it is possible to obtain accurate maximum and minimum outputs of the photoelectric conversion element array.

Figure 4:
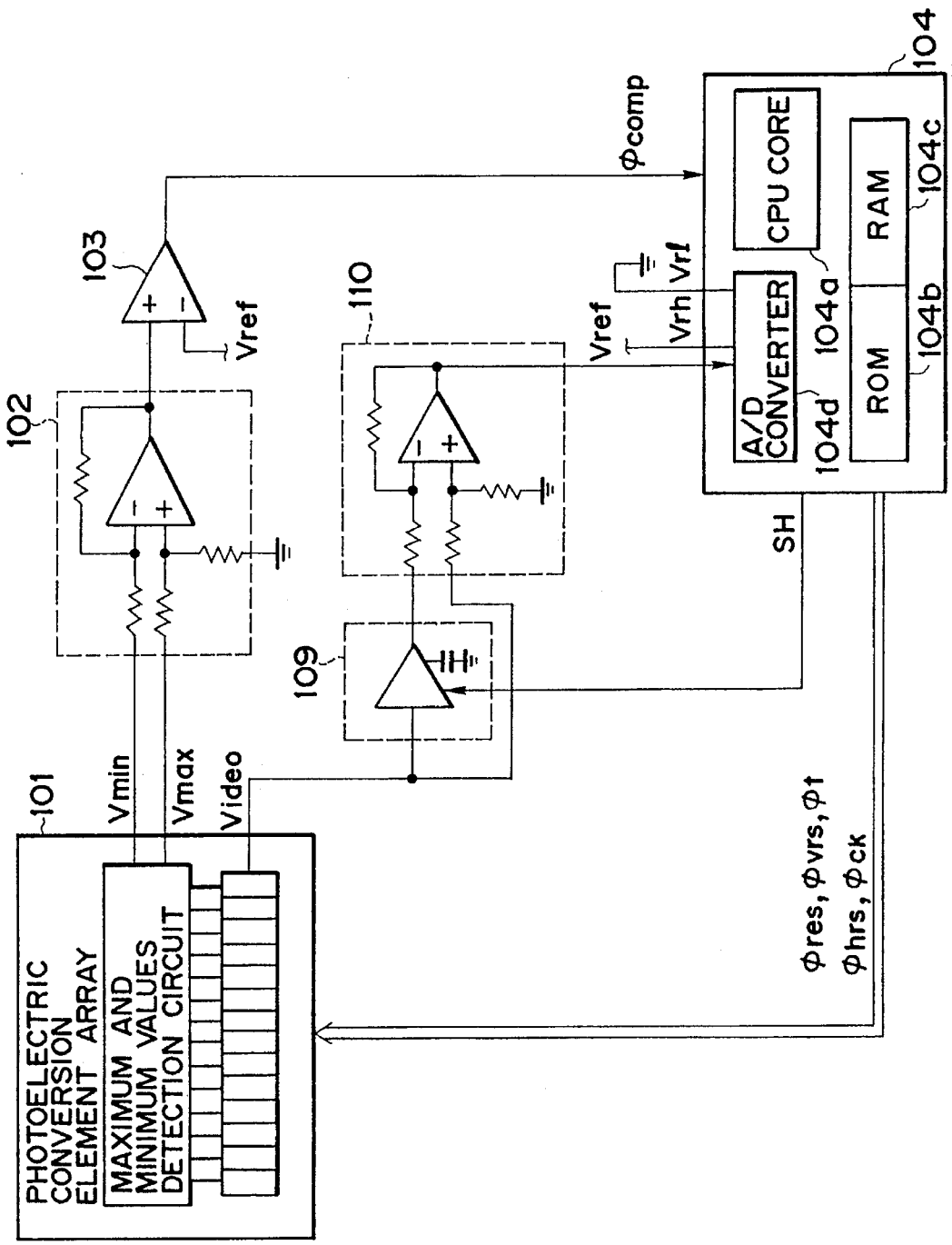
FIGS. 4 and 5 are block diagrams a specific photoelectric converter using the first embodiment of photoelectric conversion element array.
Figure 5:
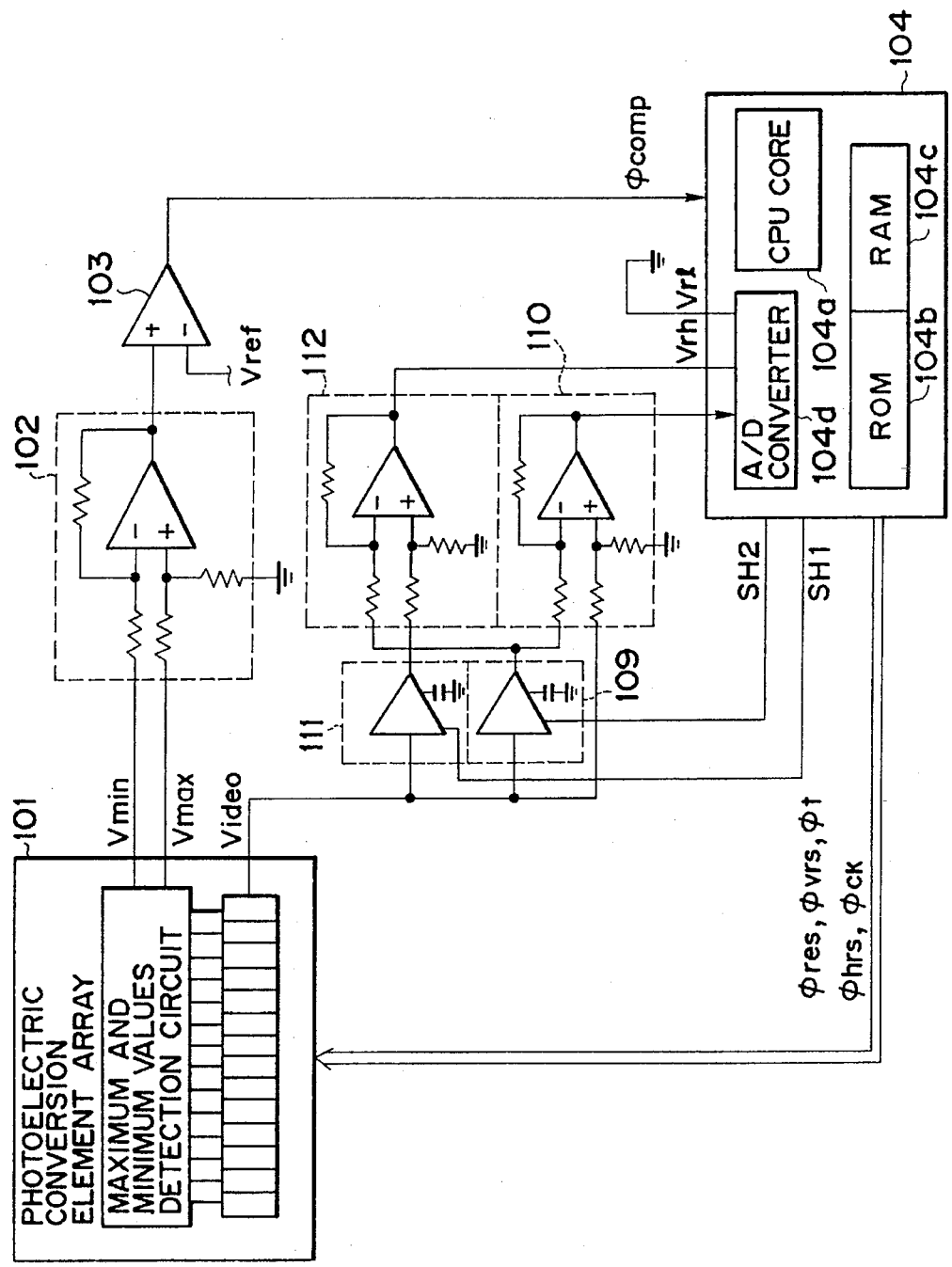

FIGS. 4 and 5 are block diagrams showing specific examples of photoelectric converter using the instant embodiment.

Referring to FIGS. 4 and 5, designated at 101 is a photoelectric conversion element array shown in FIG. 2, at 102 is a differential amplifier for taking the difference between $V_{max}$ and $V_{min}$, at 103 is a comparator for comparing the output of differential amplifier 102 and predetermined reference level $V_{ref}$ to determine reaching of an adequate storage level, at 109 and 111 are memory circuits for memorizing minimum and maximum value signals provided from video line Video, at 110 is a differential amplifier for taking the difference between the output of memory circuit 109 and output signal of photoelectric conversion element array provided from video line Video, at 112 is a differential amplifier for taking the difference between the outputs of recording circuits 111 and 109, and at 104 is a microcomputer. The microcomputer is constituted by CPU core 104a, ROM 104b, RAM 104c and A/D converter 104d.

In the photoelectric converter shown in FIG. 4, storage is started when microcomputer 104 produces reset signals $\phi_{res}$ and $\phi_{vrs}$. Subsequently, storage is stopped when $\phi_t$ is provided in response to reception of inversion signal from comparator 103. Then, reading is started when $\phi_{nrs}$ and $\phi_{ck}$ are provided. At this time, at the timing of minimum value output sampling signal SH is supplied to memory circuit 109 from microcomputer 104, and thus the minimum value is stored. The following photoelectric conversion element array output is subjected to A/D conversion differential amplifier 110 in the form of a difference with respect to the minimum value. In this A/D conversion, reference potential $V_{r1}$ is set to ground potential, and $V_{rn}$ to $V_{ref}$. Thus, the A/D conversion is performed substantially between the maximum and minimum values of the photoelectric conversion element array output. At this time, the minimum value as reference of the photoelectric conversion element array output is read out accurately compared to the case of the prior art photoelectric converter shown in FIG. 11. Thus, A/D conversion is performed accurately with respect to contract portions of the object.

In the photoelectric converter shown in FIG. 5, microcomputer 104 provides sampling signals $S_{H1}$ and $S_{H2}$ when the maximum and minimum values are provided from video line Video, respectively, and the maximum and minimum values of the photoelectric conversion element array are stored in respective memory circuits 111 and 109. The following photoelectric conversion element array output is rendered in differential amplifier 110 into a form of difference with respect to the minimum value before being supplied to the A/D converter. In this A/D conversion, reference potential $V_{r1}$ is the ground potential, but $V_{rn}$ is the difference between the maximum and minimum values obtained from differential amplifier 112. Values of $V_{min}$ and $V_{max}$ do not always accurately reflect the maximum and minimum values of the actual photoelectric conversion element array as noted before. Therefore, when storage is ended upon reaching of level $V_{ref}$ by $V_{max} - V_{min}$, the actual signal level may not be $V_{ref}$. Thus, by making the actual signal level to be A/D conversion range as in the case of the photoelectric converter shown in FIG. 4, A/D conversion can be performed by using the A/D conversion range and without possibility of exceeding the A/D conversion range.

Figure 6:
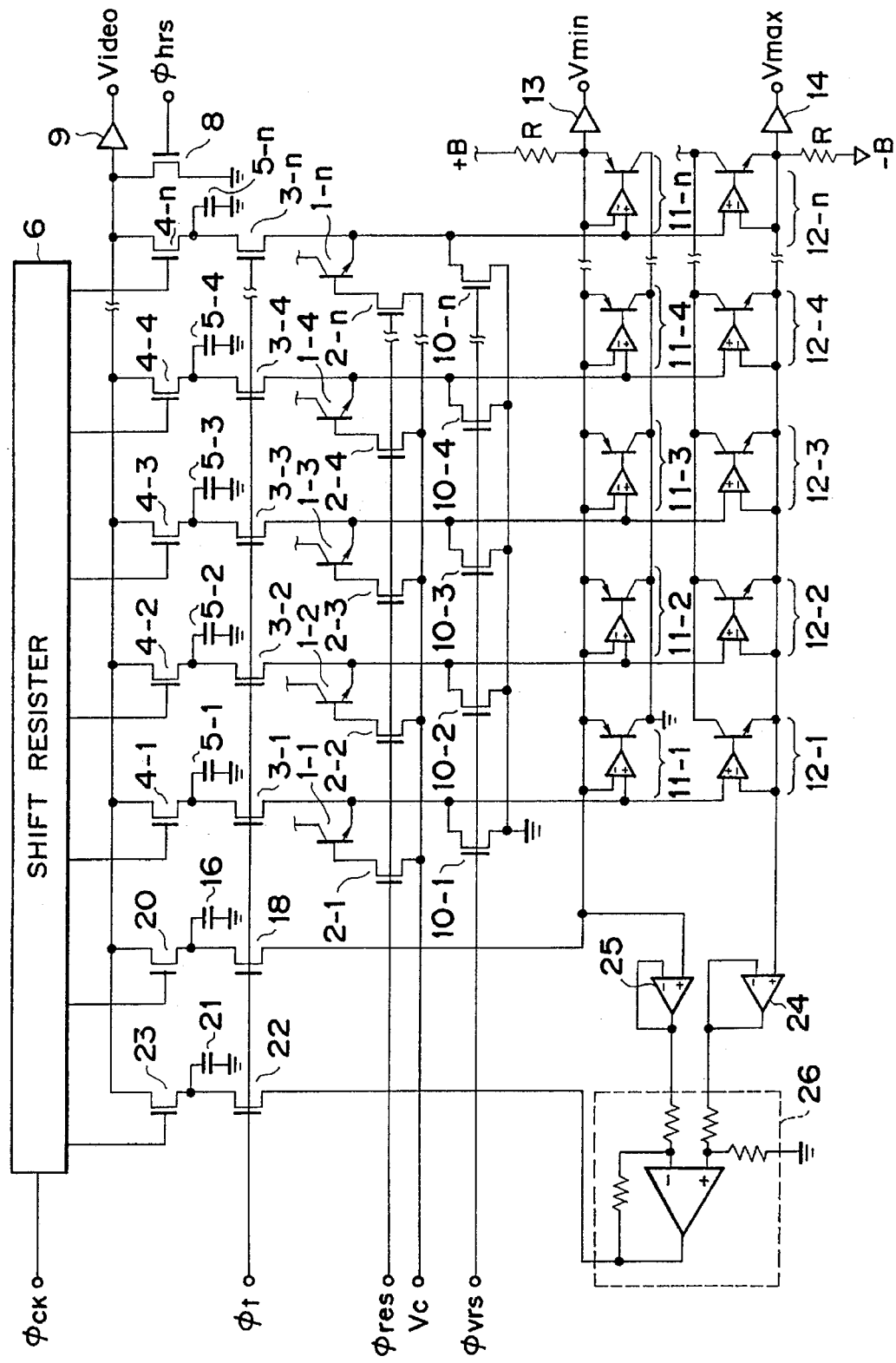
FIG. 6 is a circuit diagram showing the construction of a second embodiment of photoelectric conversion element array as featuring part of the photoelectric converter according to the invention.

FIG. 6 is a circuit diagram showing the construction of a second embodiment of photoelectric conversion element array as featuring part of the photoelectric converter according to the invention. Parts like those shown in FIG. 2 are designated by like reference numerals and symbols, and their description is not given.

A feature of this embodiment resides in that not only the maximum and minimum values of the photoelectric conversion element array output but also their difference is taken using differential amplifier 26 to be read out from the same read line as the photoelectric conversion element array. The operation is the same as in the first embodiment except for that in lieu of the maximum value of the photoelectric conversion element array output the difference between the maximum and minimum values is stored in storage capacitor 21 under control of $\phi_t$, and read out by shift register 6 through NMOS switch 23 to read line 7.

Figure 7:
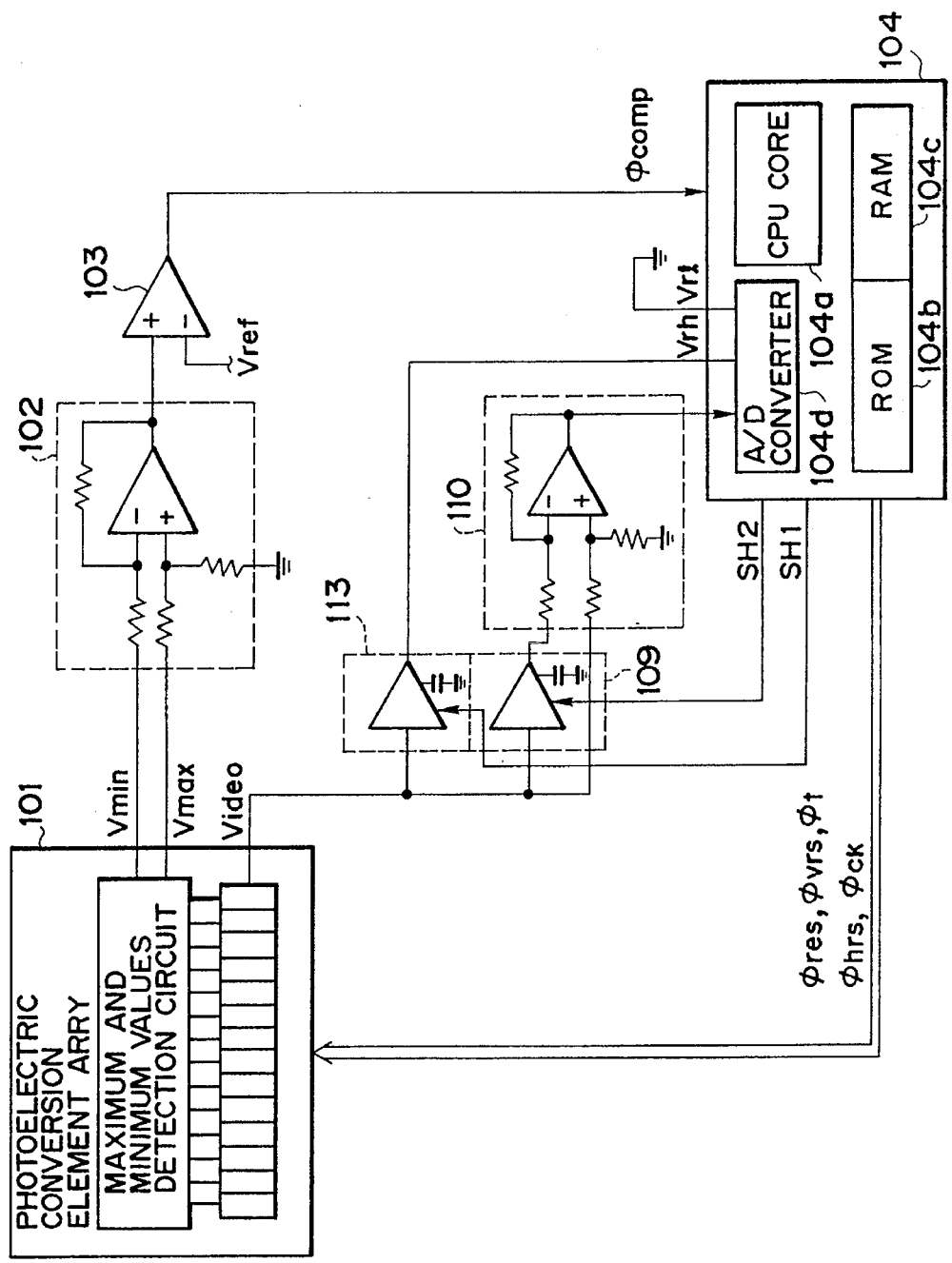
FIG. 7 is a block diagram showing a specific photoelectric converter using the second embodiment of photoelectric conversion element array.

In this case, a construction of photoelectric converter as shown in FIG. 7 may be used to obtain the same effects as in the case of photoelectric converter shown in FIG. 5. In this case, at output timings of the difference between the maximum and minimum values and the minimum value read out from video line Video the microcomputer provides sampling pulses $S_{H1}$ and $S_{H2}$, and the individual signals are stored in respective memory circuits 113 and 109. The output of memory circuit 113 assumes the level of high potential side reference potential at the time of A/D conversion, and the following photoelectric conversion element array output is A/D converted in differential amplifier 110 in the form of difference with respect to the output of memory circuit 109.

In this embodiment, the difference between the maximum and minimum values of photoelectric conversion element array storage signal is read out. However, it is possible to read out the difference of the maximum or minimum value with respect to a particular bit in the photoelectric conversion element array (e.g., blocking bit) by using the same reading system. Further, in lieu of any difference a sum or a constant number multiple may be read out when it is required in a process performed later.

As has been shown, deviation between the signal obtained the maximum and/or minimum value detection means and storage signal of photoelectric conversion element can be eliminated to obtain a signal accurately reflecting charge stored in a plurality of photoelectric conversion elements.

In addition, with the photoelectric converter according to the invention deviation between a signal calculated on the basis of the signal obtained from the maximum and/or minimum value detection means and storage signal of photoelectric conversion element can be eliminated to obtain a signal accurately reflecting charge stored in a plurality of photoelectric conversion elements.

Brief Explanation of Photoelectric Conversion Element

Figure 8:
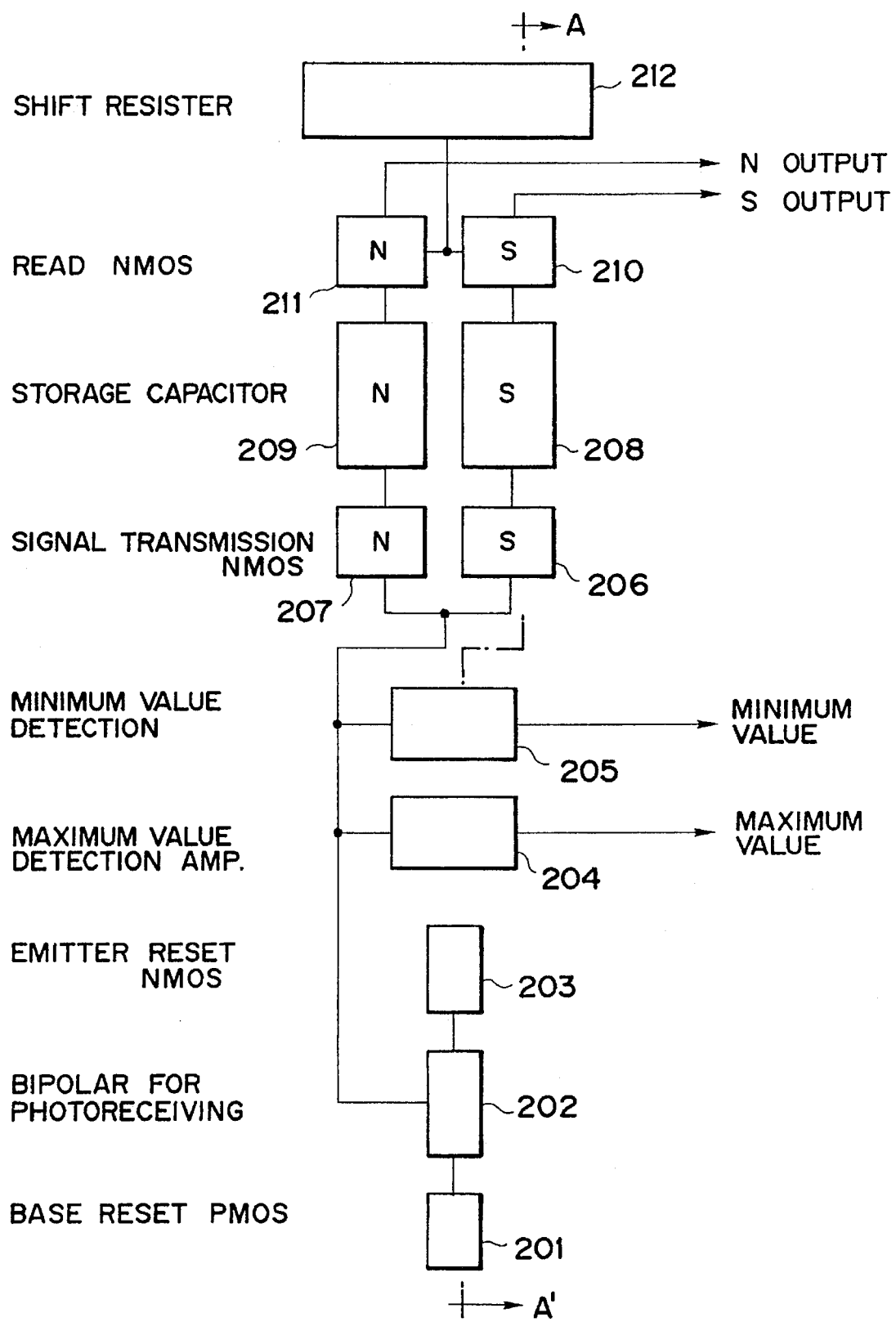
FIG. 8 is a schematic block diagram showing one bit portion of the photoelectric conversion element construction in the photoelectric converter according to the invention.

FIG. 8 is a schematic plan view showing the construction of photoelectric conversion element in photoelectric converter according to the invention. Here, the photoelectric conversion element will be described in connection with one bit of it.

FIG. 8, more particularly, is a block diagram showing one bit portion of the photoelectric conversion element according to the invention.

Designated at 202 is a bipolar transistor of a photoreceiving element serving as sensor, at 201 is a PMOS transistor for resetting the base of the bipolar transistor, and at 203 is an NMOS transistor for connecting the emitter of the PMOS transistor to a predetermined potential to thereby reset potential due to photoelectrically produced carriers stored in the base of that transistor. These three transistors can effect storage and resetting of optical signal.

Designated at 204 is an amplifier used for maximum value detection means when there are provided a plurality of one-bit blocks, and at 205 is likewise an amplifier for minimum value detection means. These amplifiers may be those as described before in connection with FIGS. 15 and 16. Signal generated from photoreceiving element is coupled through these amplifiers for detection of the maximum and minimum values.

Designated at 206 and 207 are NMOS transistors for signal transmission, at 208 and 209 are storage capacitors for storing transmitted signals, at 210 and 211 are NMOS transistors for sequentially reading out signal charge stored in the storage capacitors, and at 212 is a shift register for sequentially scanning the NMOS transistors for reading signal.

As seen, there are provided two signal transmission NMOS transistors, two storage capacitors and two read NMOS transistors. Transistor 207, capacitor 209 and transistor 211 are used for dark noise correction, and transistor 206, capacitor 208 and transistor 210 are used for signal storage. Their outputs are provided as outputs N and S to be coupled through a differential amplifier or the like for dark noise correction.

Explanation of Wafer Structure of Photoelectric Conversion Element

Figure 9A:
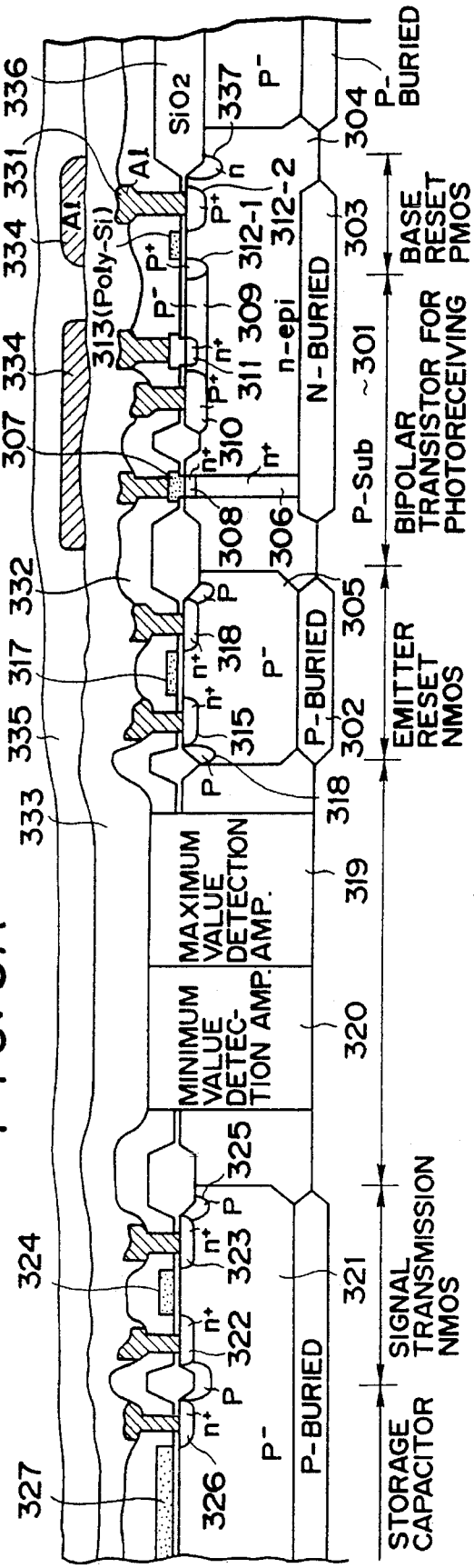
FIGS. 9A and 9B are schematic sectional views showing one bit portion of photoelectric conversion element in the photoelectric converter according to the invention.
Figure 9B:
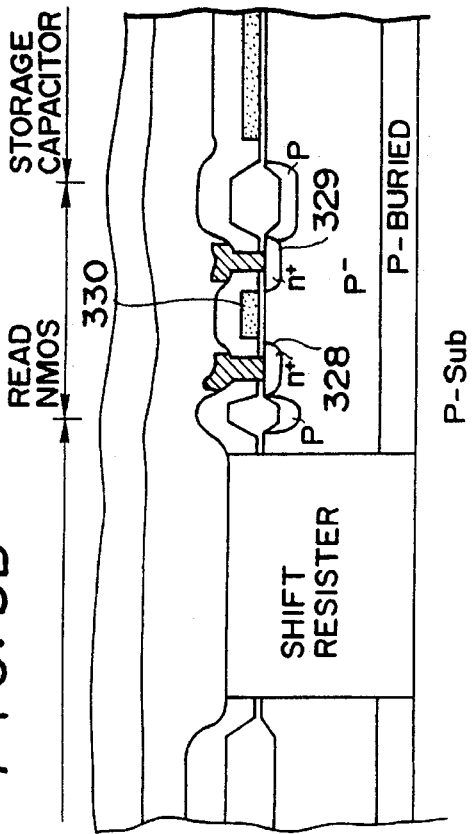

FIGS. 9A and 9B are schematic sectional views of one bit portion of the photoelectric conversion element taken along arrow line A—A' in FIG. 8. Referring to FIG. 9A, there are provided, from the right in order, a PMOS transistor for base resetting, a bipolar transistor for photoreceiving, an NMOS transistor for emitter resetting, a maximum value detection amplifier, a minimum value detection amplifier, a signal transmission NMOS transistor and a signal storage capacitor.

Referring to FIG. 9B, which is continuous to the left end of FIG. 9A, there are provided, from the right in order, a signal storage capacitor, an NMOS transistor for reading and a shift register for scanning.

To avoid complexity of the drawing and description, the special view of one photoelectric conversion element is divided into two parts.

Referring to FIGS. 9A and 9B, designated at 301 is a p-type semiconductor substrate, at 302 is a p-type buried layer containing a p-type impurity, at 303 is an n-type buried layer containing an n-type impurity, at 304 is an n⁻-type epitaxial layer (n⁻-epi) containing an n-type impurity, at 305 is a p⁻-type region slightly containing a p-type impurity, at 306 is an n⁺-type region for reducing collector resistance, at 307 is a collector electrode consisting of polysilicon, at 308 is an n⁺-type region serving as ohmic contact layer electrically connecting collector electrode 307 and n⁺-type region, at 309 is a p-type region serving as base region of the photoreceiving bipolar transistor and connected to aluminum lead 331 via p⁻-type region 310 containing a p-type impurity, and at 311 an n⁺-type region containing an n-type impurity, serving as emitter and connected to the lead via polysilicon. The PMOS transistor for base resetting has p⁻-type region 312-1 serving as source and connected to p⁻-type region 309, polysilicon provided via insulating film 336 and serving as base electrode and p⁺-type region 312-2 serving as drain. Designated at 337 is an element isolation region containing an n-type impurity and electrically connected to n⁺-type region 306. The NMOS transistor for emitter resetting has n⁺-type regions 315 and 316 formed in p⁻-type region 305 and gate electrode 317 provided via an insulating layer and consisting of polysilicon. Designated at 318 is a channel stopper containing a p-type impurity, at 319 a maximum value detection amplifier, and at 320 is a minimum value detection amplifier. The NMOS transistor for signal transmission has n⁺-type regions 322 and 323 formed in p⁻-type region 321 and gate electrode 324 provided via an insulating layer and consisting of polysilicon. Designated at 325 is a p-type region containing a p-type impurity and serving as channel stopper. The storage capacitor has p⁻-type region 321 and polysilicon electrode 327 provided via insulating layer 336. The NMOS transistor for reading has n⁺-type regions 328 and 329 formed in p⁻-type region and gate electrode 330 provided via an insulating layer and consisting of polysilicon. Designated at 338 is a p-type region containing a p-type impurity and serving as channel stopper.

Insulating layer 332 is provided between adjacent electrodes 331. Leads 331 and insulating layers 332 are covered at the top by insulating layer 333. Designated at 334 is a light-blocking layer provided at Al layer region for preventing unnecessary light from being incident on unnecessary portions (particularly regions other than sensor section). Light-blocking layer 334 is formed with windows in correspondence to photoreceiving sections of sensors.

Designated at 335 is an insulating layer provided as protective layer on the photoelectric conversion element surface.

Explanation of Additional Structure of Photoelectric Conversion Element Array

In photoelectric conversion element arrays 1001, 1002, 2001, 2002, 3001, 3002, 4001 and 4002, a dark component reading bit, a maximum value detection bit, a minimum value detection bit and dummy bits are provided in addition to the photoelectric conversion element bits for reading optical data, as shown in FIG. 10.

Figure 11:
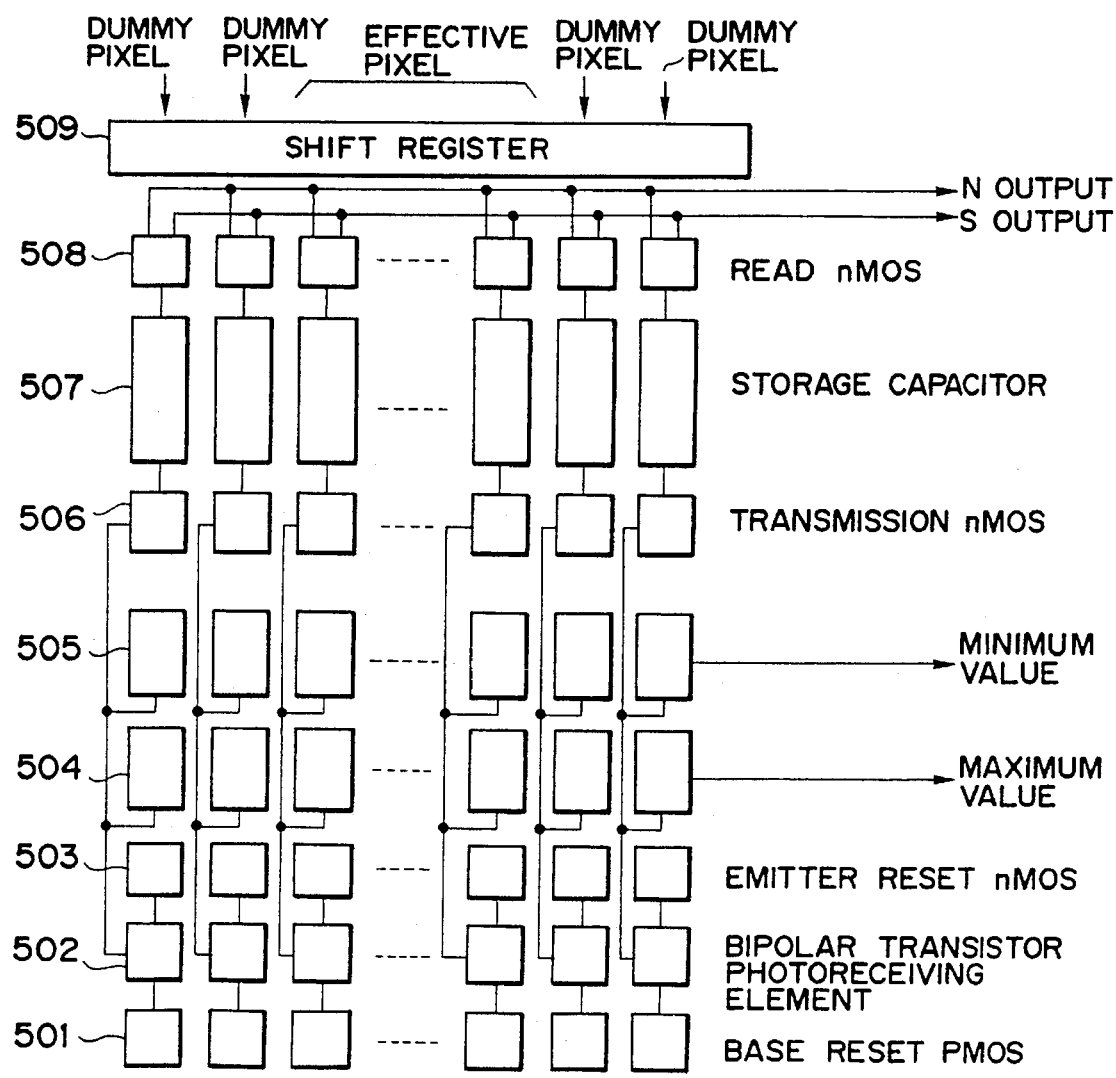
FIG. 11 is a schematic plan view showing a second construction of photoelectric conversion element array in the photoelectric converter according to the invention.

Further, in photoelectric conversion element arrays 1101, 1102, 2101, 2102, 3101, 3102, 4101 and 4102, a dark component reading bit, a maximum value detection bit, a minimum value detection bit and dummy bits are provided in addition to photoelectric conversion element bits for reading out optical data, as shown in FIG. 11.

FIG. 10 shows the construction of photoelectric conversion element arrays 1001, 1002, 2001, 2002, 3001, 3002, 4001 and 4002. Designated at 601 are p-channel MOS transistors for base resetting, at 602 are bipolar transistors serving as photoreceiving elements for performing photoelectric conversion, at 603 are n-channel MOS transistors for emitter resetting, at 604 are maximum value detection circuits, at 605 are minimum value detection circuits, at 606 are n-channel MOS transistors for signal transmission, at 607 are storage capacitors for storing signal charge, at 608 are n-channel MOS transistors for sequentially reading out charge stored in the storage capacitors, and at 609 is a shift register for scanning the reading MOS transistors. Each of blocks 606 to 608 consists of two parts, i.e., N part for noise correction and S part for signal storage, as shown in FIG. 8. Photoreceiving elements 602 are reset by MOS transistors 601 and 603 to effect storage of optical signal, and charge generated according to incident light is stored in storage capacitors 607 through MOS transistors 606. When storage is ended, shift register 609 starts scanning, and charge stored in storage capacitors 607 is progressively output through MOS transistors 608. Maximum and minimum value detection circuits 604 and 605 detect and output the maximum and minimum values, respectively, among the plurality of pixels. The photoelectric conversion element array comprises a dark pixel for reading out dark component, a maximum value detection bit and dummy pixels in addition to effective pixels for reading out optical data. The dark pixel serves to read out a dark output as reference to optical signal outputs of all pixels, and the photoreceiving element is light-blocked. The maximum and minimum value detection bits serve to read out the maximum and minimum values detected in maximum and minimum value detection circuits 604 and 605 through the same lead line as of the effective pixels. The maximum and minimum value output lines are connected through signal transmission MOS transistors 606 to storage capacitors 607. The effects in this connection are described in detail in Japanese Patent Application No. 1-301818. The minimum and maximum value detection bits having the construction noted above have no relation to the photoreceiving element outputs. However, photoreceiving elements 601 to 603 and a resetting MOS transistor are arranged on the chip in the same manner as other pixels to secure uniformity. The dammy pixels are provided around the effective pixels for precluding external influence on the effective pixels.

FIG. 11 shows the construction of photoelectric conversion elements 1101, 1102, 2101, 2102, 3101, 3102, 4101 and 4102. Designated at 501 are p-channel MOS transistors for base resetting, at 502 are bipolar transistors serving as photoreceiving elements for performing photoelectric conversion, at 503 are n-channel MOS transistors for emitter resetting, at 504 are maximum value detection circuits, at 505 are minimum value detection circuits, at 506 are n-channel MOS transistors for signal transmission, at 507 are storage capacitors for storing signal charge, at 508 are n-channel MOS transistors for sequentially reading out charge stored in the storage capacitors, and at 509 is a shift register for scanning the reading MOS transistors. Each of blocks 506 to 508 consists of two parts, i.e., N part for noise correction and S part for signal storage, as shown in FIG. 8. Photoreceiving elements 502 are reset by MOS transistors 501 and 503 to effect storage of optical signal, and charge generated according to incident light is stored in storage capacitors 507 through MOS transistors 506. When storage is ended, shift register 509 starts scanning, and charge stored in storage capacitors 507 is progressively output through MOS transistors 508. During this time, maximum and minimum value detection circuits 504 and 505 detect and output maximum and minimum values among the plurality of pixels.

The instant photoelectric conversion element array includes dammy pixels in addition to effective pixels for reading out optical data. This array is used in pair with the array described before in connection with FIG. 10. Therefore, it includes neither any dark pixel nor maximum and minimum value detection bits.

Explanation of Method of Manufacture

FIGS. 12A to 12E and 13A to 13E constitute a flow chart of an embodiment of the method of manufacturing a photoelectric conversion element array according to the invention. With reference to these Figures, the method of manufacturing the photoelectric conversion element array according to the invention will be described hereinunder.

Illustrated in FIGS. 12A to 12E and 13A to 13E is a method of manufacturing one bit portion of the photoelectric conversion element shown in FIGS. 9A and 9B, and parts like those in FIGS. 9A and 9B are designated by like reference numerals and symbols.

Since it is necessary to form bipolar npn transistors as photoreceiving elements, MOS FETs as transistors for signal transmission and resetting as well as maximum and minimum value detection circuits, analog signal processing circuit and digital circuit on the same chip, the individual elements are monolithically integrated on a silicon substrate by using Bi-CMOS process techniques.

Figure 12C:
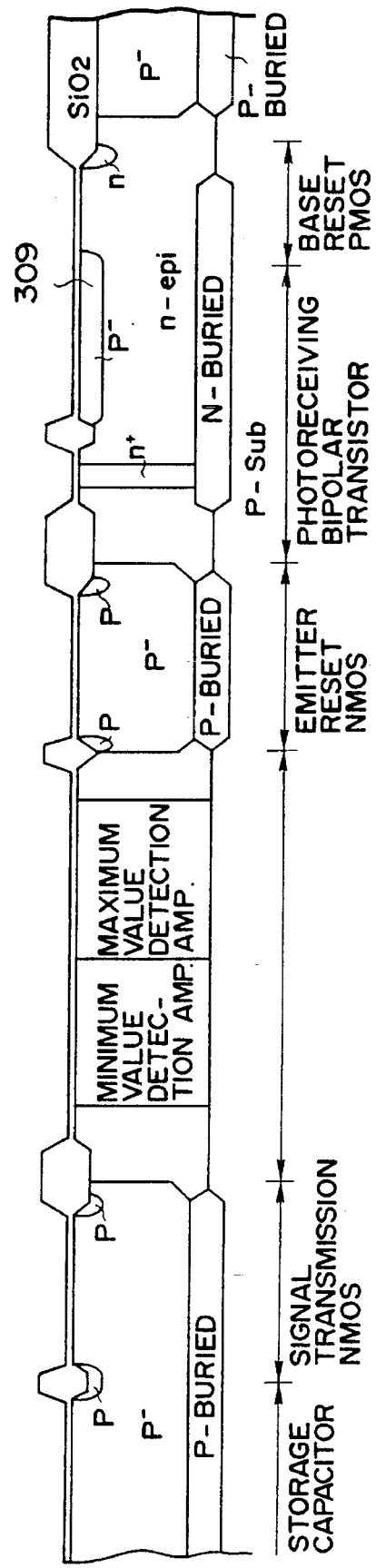
Figure 13A:
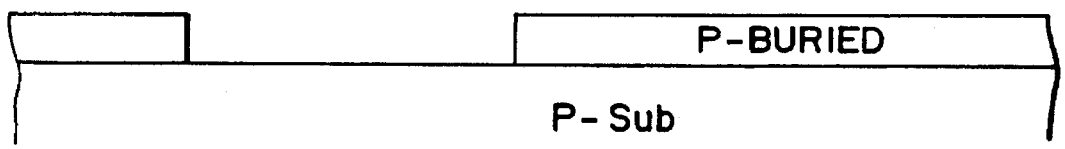
Figure 13B:
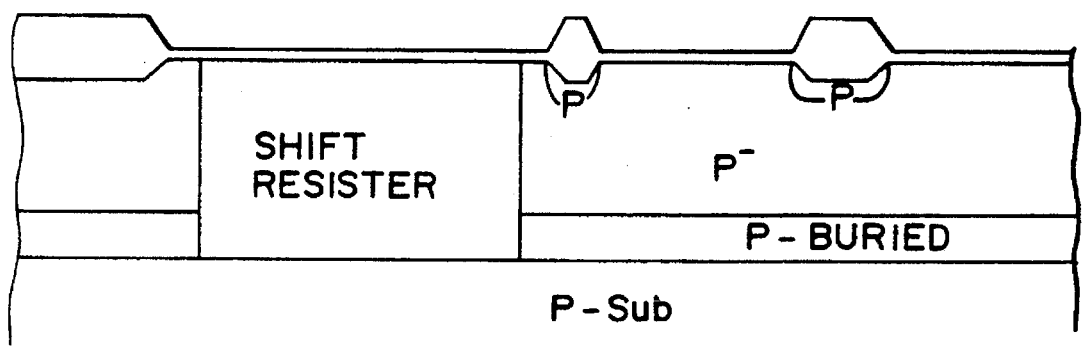

First, as shown in FIGS. 12A and 13A n- and p-type burried layers 303 and 302 are formed in p-type silicon substrate 301 using ion implantation and diffusion techniques. Arsenic and boron are used as impurities for the respective n- and p-type burried layers. Then, as shown in FIGS. 12B and 13B, n-type epitaxial layer 304 is formed by using epitaxial growth techniques, and $p^-$-type (p-well) and a $n^+$-type regions 305 and 306 are formed by ion implanting boron and phosphorus, respectively. The $n^+$-type region 306 is formed mainly for reducing the collector resistance of the npn transistors. Subsequently, field insulation film 336 is formed through selective oxidization. Then, p- and n-type regions 318 and 337 are formed by ion implantation of boron and phosphorus, respectively. These regions are generally called channel stop and are formed in order to prevent formation of parasitic transistor in element isolation region.

Figure 13C:
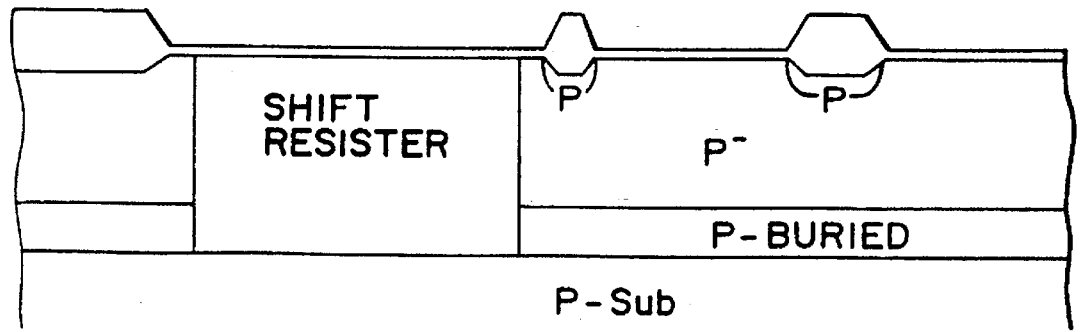

Subsequently, as shown in FIGS. 12C and 13C, p-type region 309 is formed by ion implanting boron. This region is used as base of the npn transistor, and it is used as photoreceiving section of sensor as well.

Figure 13D:
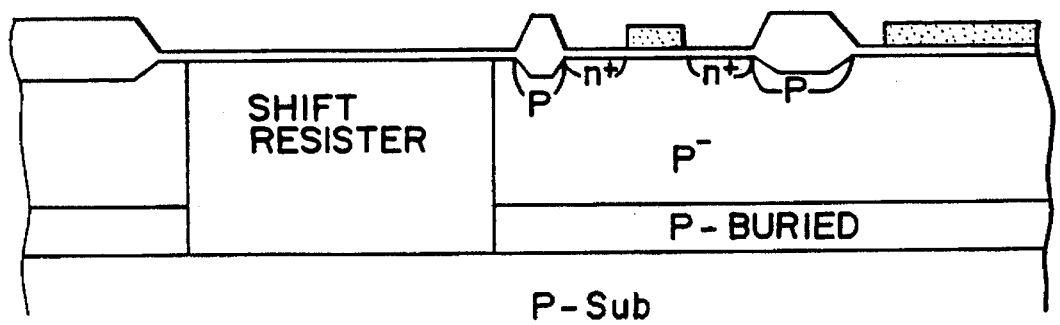

Subsequently, as shown in FIGS. 12D and 13D, emitter electrode of the npn transistor and gate electrode 313 of the MOS transistor are formed by depositing and patterning polysilicon. These polysilicon electrodes are used as a diffusion source of n-type impurity diffusion as well. They are also used as contact of collector electrode 307 of the npn transistor with phosphorus as impurity. Subsequently, n-type regions 315 and 318 are formed by ion implanting arsenic, and p-type regions 310, 312-1 and 312-2 are formed by ion implanting boron. N-type regions 315 and 318 are used as source and drain regions of n-channel MOS transistor. P-type regions 309 and 310 are used as source and drain regions of p-channel MOS transistor. P-type region 310 is used as contact of the base electrode of the npn transistor.

Figure 13E:
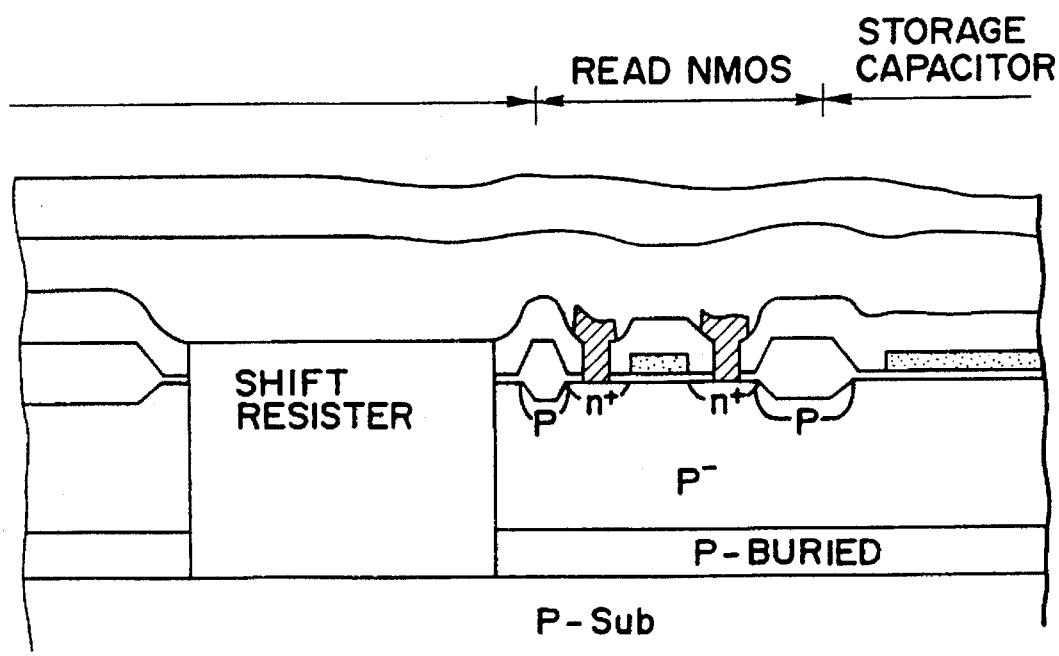

Subsequently, as shown in FIGS. 12E and 13E, insulating film 332 is deposited and patterned to form contact holes, and then aluminum is deposited and patterned to form aluminum leads 331. These leads are used for interconnecting the individual elements. Subsequently, insulating film 333 is deposited, and aluminum is deposited thereon and patterned to form aluminum regions 334. These regions are used as light-blocking film to prevent light illumination on portions other than sensor photoreceiving section. Further, insulating film 333 may be formed with contact holes (not shown), and aluminum layers 334 used as light-blocking layer noted above may be used as second aluminum lead layer electrically connected to aluminum leads in the lower layer. Finally, an uppermost protective layer consisting of PSG (phosphorus glass), SiN (silicon nitride film) or the like is formed to complete the entire process of manufacture.

Although not mentioned, the polysilicon layer may be used as element interconnection leads or capacitor electrodes as well.

Further, in highly resistive regions such as p-type regions 305 and 321 analog processing circuit or the like is frequently used as resistance.

While the light-blocking film of aluminum is shown only for a portion defining the aperture portion of the photoreceiving element which greatly depends on the operation of photoelectric conversion, it is also possible to aluminum film by the same process for light blocking of other circuits. Further, it is possible to form a light-blocking film of an organic or inorganic material on a desired portion of the outermost insulating film.

With the embodiment as described above, the following featuring functions and effects can be obtained in addition to the functions and effects noted above.

Since the signal output line from each photoelectric conversion element array is connected through the switch to the common signal line extending over a gap defined by central four photoelectric conversion element arrays, the lengths of the signal output lines and common signal line may be reduced to reduce possibility of noise generation, reduce CR constant and prevent delay of signal and signal-to-noise ratio reduction.

Now, the photoelectric converter according to the invention will be described in connection with a case where it is utilized as focus detection unit of an optical apparatus. The following description concerns an example of use of the converter for a camera. However, the converter may of course be used for focus detection in other optical apparatuses such as a slide projector, a liquid crystal projector, etc., in which video image is projected onto a screen or the like.

Figure 20:
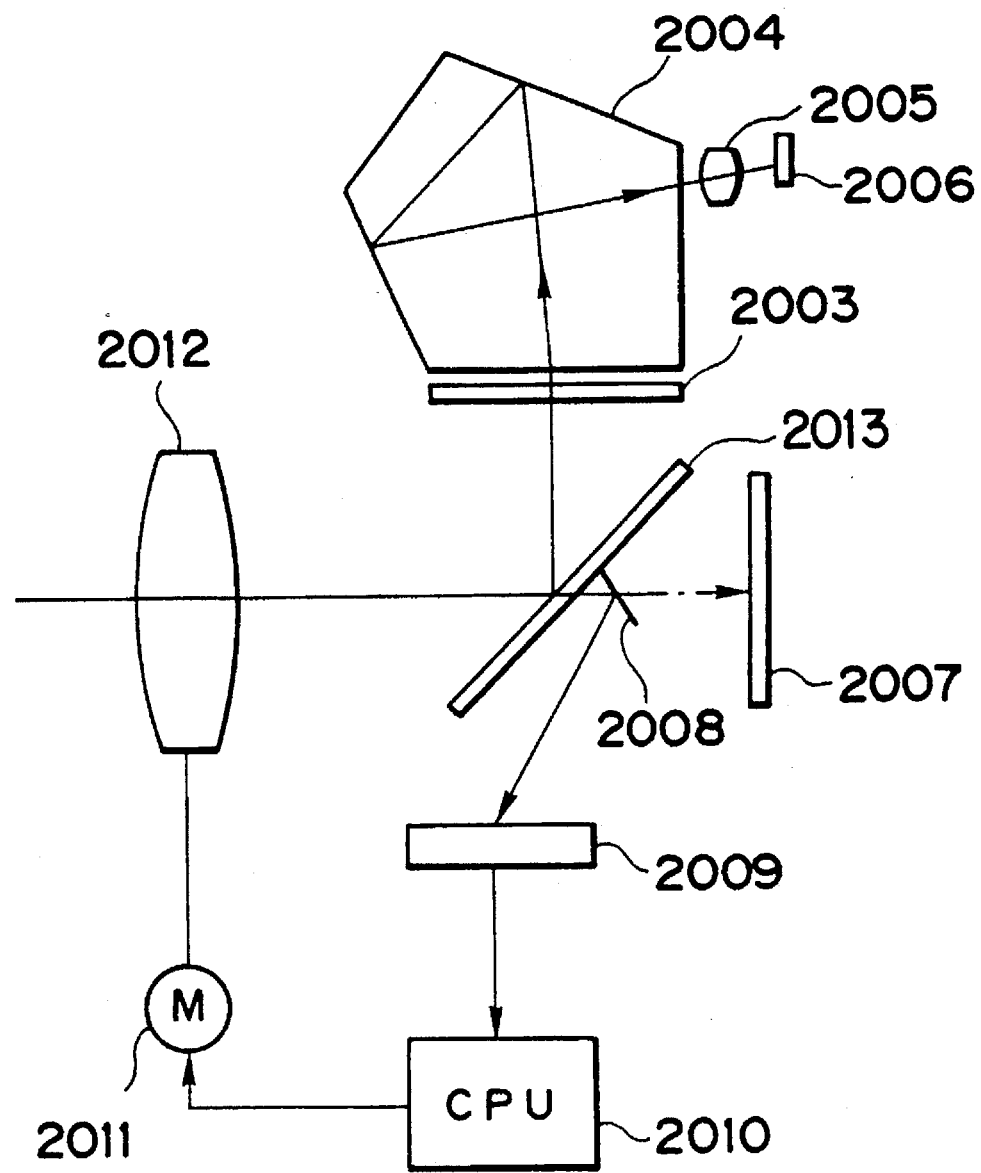
FIG. 20 is a schematic view showing a camera incorporating the photoelectric converter according to the invention.

FIG. 20 is a schematic view showing a camera, i.e., a commonly termed single-lens reflex camera. Designated at 2012 is an image pick-up optical system for focusing an object image on film 2007 or on focus plate 2004. Light image transmitted through image pick-up optical system 2012 is bent by main mirror 2013 to be focused on focus plate 2003, and this image is then led by pentaprism 2004 and eyepiece lens 2005 to a photosensor or to eyes. In addition, the image is also led by a half mirror section provided on main mirror 2002, and part of light image is bent by sub-mirror 2008 to be led to focus detection unit 2009. This focus detection unit 2009 has the photoelectric converter as described before. The detection of focus is done with reference to the peak and bottom values of the output signal as described before. If no focus is detected according to these data, pertaining lenses or the like of optical system 2012 are moved by motor 2011 to obtain focus. CPU 2010 undertakes control for the focusing as noted above. For picking up image, main mirror 2013 and sub-mirror 2008 are kicked upwards in the Figure, and a shutter (not shown) provided right in front of film 2007 is operated as desired.

When the photoelectric converter according to the invention was actually used for a camera as described above, it was possible to pick up image with very accurate and excellent focus characteristics.

Effects of the Embodiment

As has been described in the foregoing, the maximum/minimum value detection circuit has a monolithic structure located between photoreceiving element and reading circuit, and with this structure the following effects can be obtained.

(1) Compared to a structure where the detection circuit is provided separately, the signal-to-noise ratio can be greatly improved, and the cost of manufacture can be greatly reduced.

(2) In comparison to even a different arrangement structure where the detection circuit is formed integrally, the signal-to-noise can be improved, the area of semiconductor substrate used as chip can be reduced, and the cost of manufacture is further reduced.

We claim:

1. A photoelectric converter provided on a common semiconductor substrate, comprising:

(a) a plurality of arrays, each array comprising a respective plurality of plural photoreceiving elements arranged for detecting incident light, wherein said plurality of arrays comprises first, second, third and fourth groups of arrays, each group comprising at least two arrays, wherein said arrays of said first group are arranged substantially perpendicular to said arrays of said second group so as to cross said arrays of said second group, said arrays of said first and second groups being sandwiched between said arrays of said third group and said fourth group, and said arrays of said third and fourth groups being arranged substantially parallel to said arrays of said second group;

(b) a plurality of reading means arranged correspondingly adjacent to each array of said photoreceiving elements, each said reading means for reading an output signal from said corresponding array; and (c) level detecting means arranged correspondingly to each of said arrays of photoreceiving elements for detecting a maximum signal level and a minimum signal level from said corresponding array, said level detecting means being arranged at least between said arrays of photoreceiving elements and said reading means.

2. A photoelectric converter according to claim 1, further comprising a signal processing circuit, provided on the common substrate, for processing a signal read out from said reading means.

3. A photoelectric converter according to claim 1, further comprising a charge eliminating means for eliminating a charge stored in said photoreceiving elements.

4. A photoelectric converter according to claim 1, wherein each said reading means comprises a storage means for storing a signal based on a signal charge photoelectrically produced, and transfer means having an output line common to said storage means, for transferring the signal stored in said storage means.

5. A photoelectric converter according to claim 4, further comprising reset means, provided within each said storage means, for resetting a potential of said storage means to a predetermined potential.

6. A photoelectric converter according to claim 1, further comprising a digital circuit including a clock signal generating circuit for generating a clock signal as a reference for driving said photoelectric conversion element arrays.

7. A photoelectric converter according to claim 1, wherein the outputs from said reading means are processed at a single analog signal processing section.

8. A photoelectric converter according to claim 1, further comprising a digital circuit including a clock signal generating circuit and an analog signal processing circuit, wherein said digital circuit and said analog signal processing circuit are arranged on an edge of the common substrate.

9. An optical apparatus comprising a photoelectric converter according to claim 1.

10. An optical apparatus according to claim 9, wherein said optical apparatus is a camera.

* * * * *

UNITED STATES PATENT AND TRADEMARK OFFICE
CERTIFICATE OF CORRECTION

PATENT NO. : 5,591,960

DATED : January 7, 1997

INVENTOR(S): Tatsuo Furukawa, et al.

It is certified that error appears in the above-identified patent and that said Letters Patent is hereby corrected as shown below:

On the title page,
AT [56] REFERENCES CITED AT FOREIGN PATENT DOCUMENTS
Insert:
--54-107313  8/23/79  Japan
  58-142306  8/24/83  Japan
  60-101513  6/5/85   Japan
  61-018314  1/27/86  Japan
  62-113468  5/25/87  Japan
  62-128678  6/10/87  Japan
  63-24664   2/2/88   Japan
  63-76476   4/6/88   Japan
  63-76582   4/6/88   Japan
  01-222583  9/5/89   Japan
  03-163972  7/15/91  Japan--

"0311529 12/1989 Euro Pat. Off." should read
  --0311529 4/1989 Euro. Pat. Off.--

"58-127370 10/1983 Japan" should read
  --58-127370 7/1983 Japan--.

COLUMN 4
  Line 2, "1-301818" should read --3-163972--.
  Line 59, "in" should be deleted.

COLUMN 5
  Line 33, "diagrams" should read --diagrams of--.

UNITED STATES PATENT AND TRADEMARK OFFICE
CERTIFICATE OF CORRECTION

PATENT NO. : 5,591,960

DATED : January 7, 1997

INVENTOR(S) : Tatsuo Furukawa, et al.

Page 2 of 2

It is certified that error appears in the above-identified patent and that said Letters Patent is hereby corrected as shown below:

COLUMN 12
   Line 29, "dammy" should read --dummy--.
   Line 58, "dammy" should read --dummy--.

COLUMN 14
   Line 10, "to aluminum" should read --to form aluminum--.

Signed and Sealed this

Nineteenth Day of August, 1997

Attest:

BRUCE LEHMAN

Attesting Officer

*Commissioner of Patents and Trademarks*